United States Patent
Tsuji

(10) Patent No.: US 12,438,057 B2
(45) Date of Patent: Oct. 7, 2025

(54) SEMICONDUCTOR DEVICE AND PACKAGE

(71) Applicant: Sumitomo Electric Industries, Ltd., Osaka (JP)

(72) Inventor: Harutoshi Tsuji, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 464 days.

(21) Appl. No.: 17/834,107

(22) Filed: Jun. 7, 2022

(65) Prior Publication Data

US 2023/0005800 A1 Jan. 5, 2023

(30) Foreign Application Priority Data

Jun. 30, 2021 (JP) ................................. 2021-109174

(51) Int. Cl.
*H01L 23/047* (2006.01)
*H01L 23/00* (2006.01)
*H01L 25/16* (2023.01)

(52) U.S. Cl.
CPC ............ *H01L 23/047* (2013.01); *H01L 24/32* (2013.01); *H01L 24/48* (2013.01); *H01L 24/73* (2013.01);
(Continued)

(58) Field of Classification Search
CPC ....... H01L 23/047; H01L 23/66; H01L 25/16; H01L 23/10; H01L 23/04; H01L 23/14; H01L 23/642; H01L 24/32; H01L 24/48; H01L 24/73; H01L 24/49; H01L 2223/6611; H01L 2223/6655; H01L 2224/32245; H01L 2224/48137; H01L 2224/48175; H01L 2224/73265;
(Continued)

(56) References Cited

U.S. PATENT DOCUMENTS

| | | | |
|---|---|---|---|
| 2012/0014069 A1* | 1/2012 | Zeng ...................... | H01L 25/115 29/841 |
| 2012/0067871 A1* | 3/2012 | Sherrer .................. | B05D 3/007 219/678 |

(Continued)

FOREIGN PATENT DOCUMENTS

| | | | | |
|---|---|---|---|---|
| DE | 112015000245 T5 * | 9/2016 | ............. | H01L 23/08 |
| JP | 04-188652 A | 7/1992 | | |

(Continued)

*Primary Examiner* — Teresa M. Arroyo

(74) *Attorney, Agent, or Firm* — Volpe Koenig

(57) ABSTRACT

A semiconductor device includes: a conductive base substrate; a semiconductor chip mounted on the base substrate and having a signal pad; a frame configured to surround the semiconductor chip, to be mounted on the base substrate, and to include a step having an inner first upper surface and an outer second upper surface higher than the first upper surface in a plan view, wherein a first conductor pattern provided on the first upper surface is electrically connected to the base substrate; a capacitive component mounted on the first conductor pattern; a signal terminal mounted on the second upper surface of the frame; a first bonding wire configured to electrically connect the signal pad and an upper surface of the capacitive component; and a second bonding wire configured to electrically connect the upper surface of the capacitive component and the signal terminal.

14 Claims, 18 Drawing Sheets

(52) U.S. Cl.
CPC .... *H01L 25/16* (2013.01); *H01L 2224/32245* (2013.01); *H01L 2224/48137* (2013.01); *H01L 2224/48175* (2013.01); *H01L 2224/73265* (2013.01); *H01L 2924/1033* (2013.01); *H01L 2924/1205* (2013.01); *H01L 2924/13064* (2013.01); *H01L 2924/13091* (2013.01); *H01L 2924/1715* (2013.01)

(58) Field of Classification Search
CPC . H01L 2224/48011; H01L 2224/48195; H01L 2224/49111; H01L 2224/49175; H01L 2924/1715; H01L 2924/1033; H01L 2924/1205; H01L 2924/13064; H01L 2924/13091; H01L 2924/00014; H01L 2924/16152; H01L 2924/1616; H01L 2924/30107; H01L 2224/45099; H03F 1/565; H03F 3/195
See application file for complete search history.

(56) References Cited

U.S. PATENT DOCUMENTS

| | | | |
|---|---|---|---|
| 2013/0069218 A1* | 3/2013 | Seah | H01L 25/03 438/118 |
| 2017/0103962 A1* | 4/2017 | Oomae | H01L 21/4825 |
| 2017/0365632 A1* | 12/2017 | Tu | H01L 31/0203 |
| 2018/0315721 A1* | 11/2018 | Sato | H01L 21/4875 |
| 2020/0053883 A1 | 2/2020 | Inoue | |

FOREIGN PATENT DOCUMENTS

| | | |
|---|---|---|
| JP | 2008-109122 A | 5/2008 |
| JP | 2019-530202 A | 10/2019 |

* cited by examiner

SEMICONDUCTOR DEVICE AND PACKAGE

BACKGROUND OF THE INVENTION

1. Field of the Invention

The present invention relates to a semiconductor device and a package, for instance, a semiconductor device on which a semiconductor chip and a capacitive component are mounted, and a package.

2. Description of the Related Art

In a known art, a semiconductor chip, a capacitive component and a frame are mounted on a base substrate, a pad on the semiconductor chip and the upper surface of the capacitive component are connected by bonding wires, and the upper surface of the capacitive component and a signal terminal on the frame are connected by bonding wires (for instance, Japanese Unexamined Patent Application Publication No. 2019-530202).

SUMMARY OF THE INVENTION

An embodiment of the present disclosure provides a semiconductor device including: a conductive base substrate; a semiconductor chip mounted on the base substrate and having a signal pad; a frame configured to surround the semiconductor chip, to be mounted on the base substrate, and to include a step having an inner first upper surface and an outer second upper surface higher than the first upper surface in a plan view, wherein a first conductor pattern provided on the first upper surface is electrically connected to the base substrate; a capacitive component mounted on the first conductor pattern; a signal terminal mounted on the second upper surface of the frame; a first bonding wire configured to electrically connect the signal pad and an upper surface of the capacitive component; a second bonding wire configured to electrically connect the upper surface of the capacitive component and the signal terminal; and a cover configured to be joined to the second upper surface of the frame, and to seal the semiconductor chip in space.

An embodiment of the present disclosure provides a package including: a conductive base substrate configured to have an area on which a semiconductor chip is mountable; and a frame configured to surround the semiconductor chip, to be mounted on the base substrate, and to include a step having an inner first upper surface and an outer second upper surface higher than the inner first upper surface in a plan view, wherein the first upper surface is electrically connected to an upper surface of the base substrate and the second upper surface has an area on which a capacitive component electrically separated from the base substrate is mountable.

DESCRIPTION OF THE PREFERRED EMBODIMENTS

Figure 1:
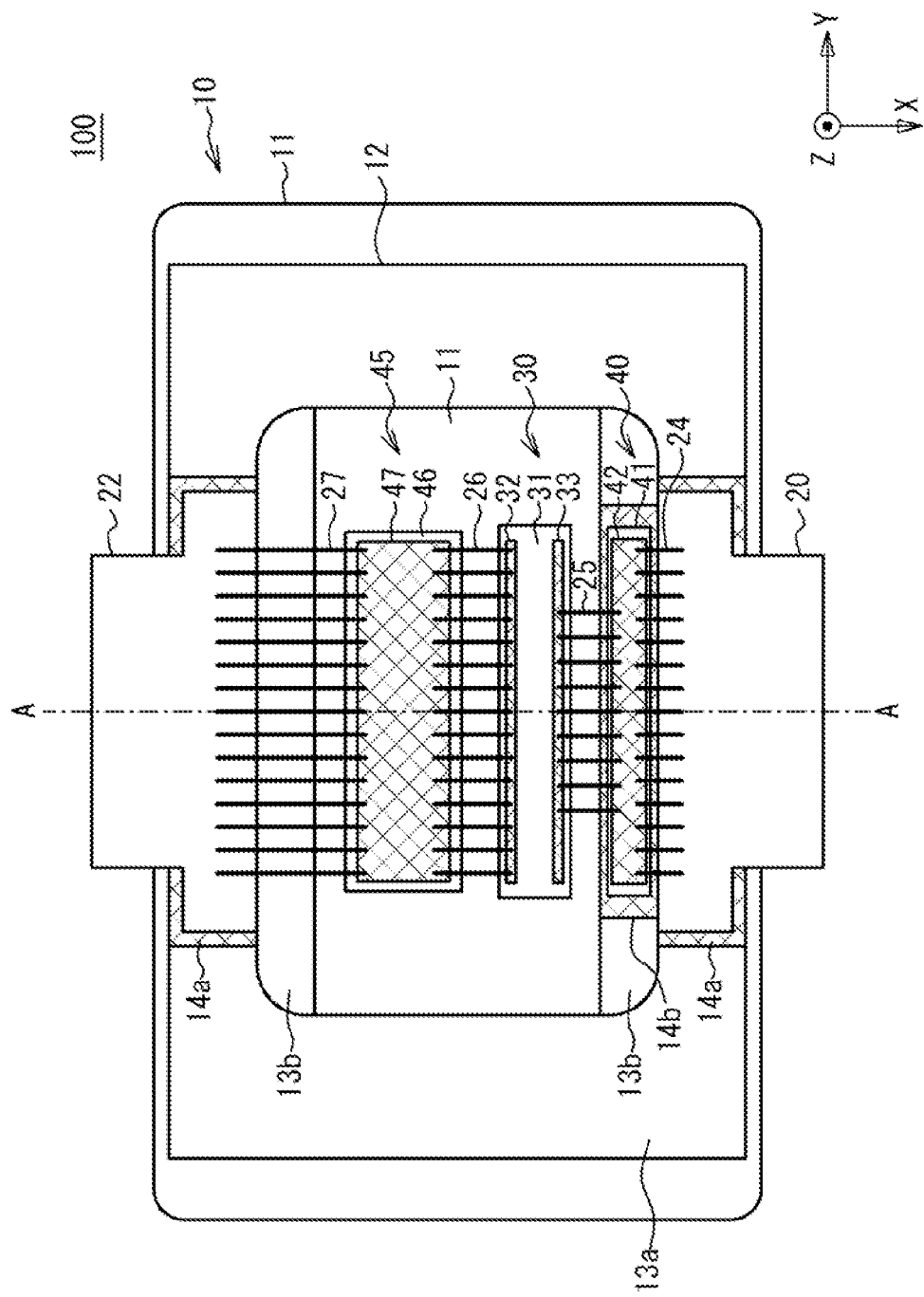
FIG. 1 is a plan view of a semiconductor device according to Example 1.

To secure the joint strength between a base substrate and a frame, the frame is required to have a predetermined width or more. For this reason, when a semiconductor chip and a capacitive component are mounted within the frame on the base substrate, the semiconductor device increases in size.

The present disclosure has been made in view of the above-mentioned problem, and it is an object to downsize the semiconductor device.

DESCRIPTION OF EMBODIMENT OF PRESENT DISCLOSURE

First, the details of an embodiment of the present disclosure will be listed and described.

(1) An embodiment of the present disclosure provides a semiconductor device including: a conductive base substrate; a semiconductor chip mounted on the base substrate and having a signal pad; a frame configured to surround the semiconductor chip, to be mounted on the base substrate, and to include a step having an inner first upper surface and an outer second upper surface higher than the first upper surface in a plan view, wherein a first conductor pattern provided on the first upper surface is electrically connected to the base substrate; a capacitive component mounted on the first conductor pattern; a signal terminal mounted on the second upper surface of the frame; a first bonding wire configured to electrically connect the signal pad and an upper surface of the capacitive component; a second bonding wire configured to electrically connect the upper surface of the capacitive component and the signal terminal; and a cover configured to be joined to the second upper surface of the frame, and to seal the semiconductor chip in space. Thus, the semiconductor device can be downsized.

(2) The second bonding wire may be joined to the signal terminal.

(3) The height difference between the upper surface of the capacitive component and an upper surface of the signal terminal may be smaller than the difference between the thickness of the capacitive component and the thickness of the signal terminal.

(4) The cover may include a lateral portion joined to the second upper surface of the frame, and an upper portion provided above the semiconductor chip, and the lateral portion may be joined to the upper surface of the signal terminal outwardly in a plan view of a position at which the second bonding wire is joined to the signal terminal.

(5) The step may have a third upper surface between the first upper surface and the second upper surface in a plan view, the third upper surface being higher than the first upper surface and lower than the second upper surface, a second conductor pattern electrically connected to the signal terminal may be provided on the third upper surface, and the second bonding wire may be connected to the signal terminal via the second conductor pattern.

(6) The height difference between the upper surface of the capacitive component and an upper surface of the second conductor pattern may be smaller than the difference between the thickness of the capacitive component and the height difference between the first upper surface and the second upper surface.

(7) The cover may include a lateral portion joined to the second upper surface of the frame, and an upper portion provided above the semiconductor chip, and the lateral portion may be joined to the second upper surface and may not be joined to the third upper surface.

(8) The semiconductor chip may include a transistor, and the signal pad may be at least one of an input pad via which a high-frequency signal is input to the transistor and an output pad via which a high-frequency signal is output from the transistor.

(9) The first conductor pattern and the base substrate may be electrically connected by a through electrode that penetrates the frame or by another conductor layer provided on an inner lateral face of the frame.

(10) An embodiment of the present disclosure provides a package including: a conductive base substrate configured to have an area on which a semiconductor chip is mountable; and a frame configured to surround the semiconductor chip, to be mounted on the base substrate, and to include a step having an inner first upper surface and an outer second upper surface higher than the inner first upper surface in a plan view, wherein the first upper surface is electrically connected to an upper surface of the base substrate and the second upper surface has an area on which a capacitive component electrically separated from the base substrate is mountable.

Details of Embodiment of Present Disclosure

A specific example of a semiconductor device and a package according to an embodiment of the present disclosure will be described below with reference to the drawings. Note that the present disclosure is not limited to these illustrations, and it is intended that the present disclosure be defined by the appended claims, and all changes within the meaning and range of equivalency of the claims be embraced therein.

Example 1

Figure 2:
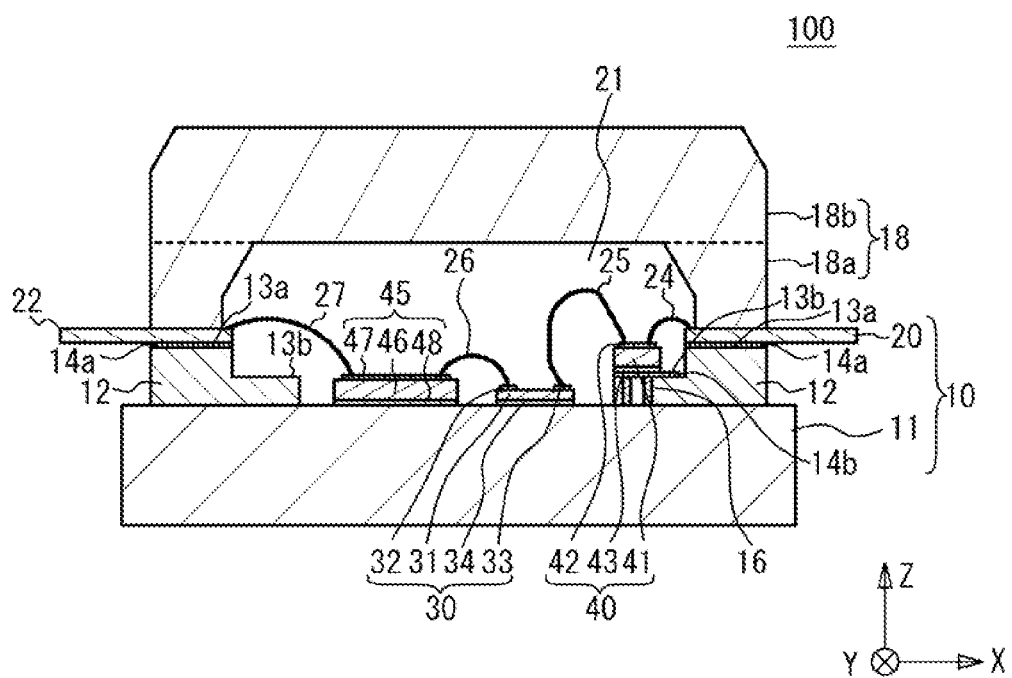
FIG. 2 is a cross-sectional view along A-A of FIG. 1.

FIG. 1 is a plan view of a semiconductor device according to Example 1. FIG. 2 is a cross-sectional view along A-A of FIG. 1. FIG. 1 is a plan view with a cover 18 removed. Let Z-direction be the normal direction of the upper surface of a base substrate 11, X-direction be the direction from an input lead 22 to an output lead 20, and Y-direction be the direction perpendicular to the X-direction and the Z-direction.

As illustrated in FIG. 1 and FIG. 2, in a semiconductor device 100 of Example 1, a package 10 mainly has a base substrate 11, a frame 12 and a cover 18. The base substrate 11 is a conductive material such as a laminated substrate of copper and molybdenum, for instance. A reference potential such as the ground potential is supplied to the base substrate 11. The frame 12 and the cover 18 are dielectric layers comprised of resin or ceramic such as Flame Retardant Type 4 (FR-4), for instance. In the frame 12, at the edges on the ±X side, an inner upper surface 13b is lower than an outer upper surface 13a. The upper surface 13a is provided with a conductor pattern 14a, and the upper surface 13b is provided with a conductor pattern 14b. The conductor pattern 14b on the +X side is electrically connected to the base substrate 11 via a through electrode 16. In other words, the conductor pattern 14b and the base substrate 11 have substantially the same potential. The conductor pattern 14a is electrically separated from the base substrate 11. The conductor patterns 14a, 14b and the through electrode 16 are metal layers such as gold layers or copper layers, and are plated metal, for instance. The input lead 22 is mounted on the −X side conductor pattern 14a, and the output lead 20 is mounted on the +X side conductor pattern 14b. The input lead 22 and the output lead 20 are metal leads which are gold plated copper leads, for instance. The base substrate 11 has an area on which the semiconductor chip 30 is mountable, and the upper surface 13b of a thin film section 12b of the frame 12 has an area on which a capacitive component 40 is mountable.

The semiconductor chip 30 and a capacitive component 45 are mounted on the base substrate 11. The semiconductor chip 30 includes a semiconductor substrate 31, electrodes 32 and 33 provided on the upper surface of the semiconductor substrate 31, and an electrode 34 (see FIG. 3) formed on the lower surface of the semiconductor substrate 31. The electrodes 32, 33 and 34 are a gate electrode, a drain electrode and a source electrode, respectively. The electrodes 32 and 33 are signal pads such as an input pad and an output pad, respectively. The electrodes 32, 33 and 34 are metal layers such as gold layers, for instance. The electrode 34 is electrically connected and short-circuited to the base substrate 11. The capacitive component 45 includes a dielectric substrate 46, an electrode 47 provided on the upper surface of the dielectric substrate 46, and an electrode 48 provided on the lower surface of the dielectric substrate 46. The electrode 48 is electrically connected and short-circuited to the base substrate 11. The capacitive component 40 is mounted on the conductor pattern 14b provided on the upper surface 13b. The capacitive component 40 includes a dielectric substrate 41, an electrode 42 provided on the upper surface of the dielectric substrate 41, and an electrode 43 provided on the lower surface of the dielectric substrate 41. The electrode 43 is electrically connected and short-circuited to the base substrate 11 via the through electrode 16. The electrode 43 and the base substrate 11 have the same potential. The dielectric substrates 41 and 46 are, for instance, high dielectric ceramic materials having a dielectric constant of 30 or more, and the electrodes 42, 43, 47 and 48 are metal layers such as gold layers.

A bonding wire 24 electrically connects the output lead 20 and the electrode 42 of the capacitive component 40. A bonding wire 25 electrically connects the electrode 42 of the capacitive component 40 and the electrode 33 of the semiconductor chip 30. A bonding wire 26 electrically connects the electrode 32 of the semiconductor chip 30 and the electrode 47 of the capacitive component 45. A bonding wire 27 electrically connects the electrode 47 of the capacitive component 45 and the input lead 22. The cover 18 has a lateral section 18a joined to the upper surface 13a of the frame 12, and an upper section 18b provided above the semiconductor chip 30, and the capacitive components 40 and 45. The cover 18 seals the semiconductor chip 30, and the capacitive components 40 and 45 in a space 21 which is gaseous.

Figure 3:
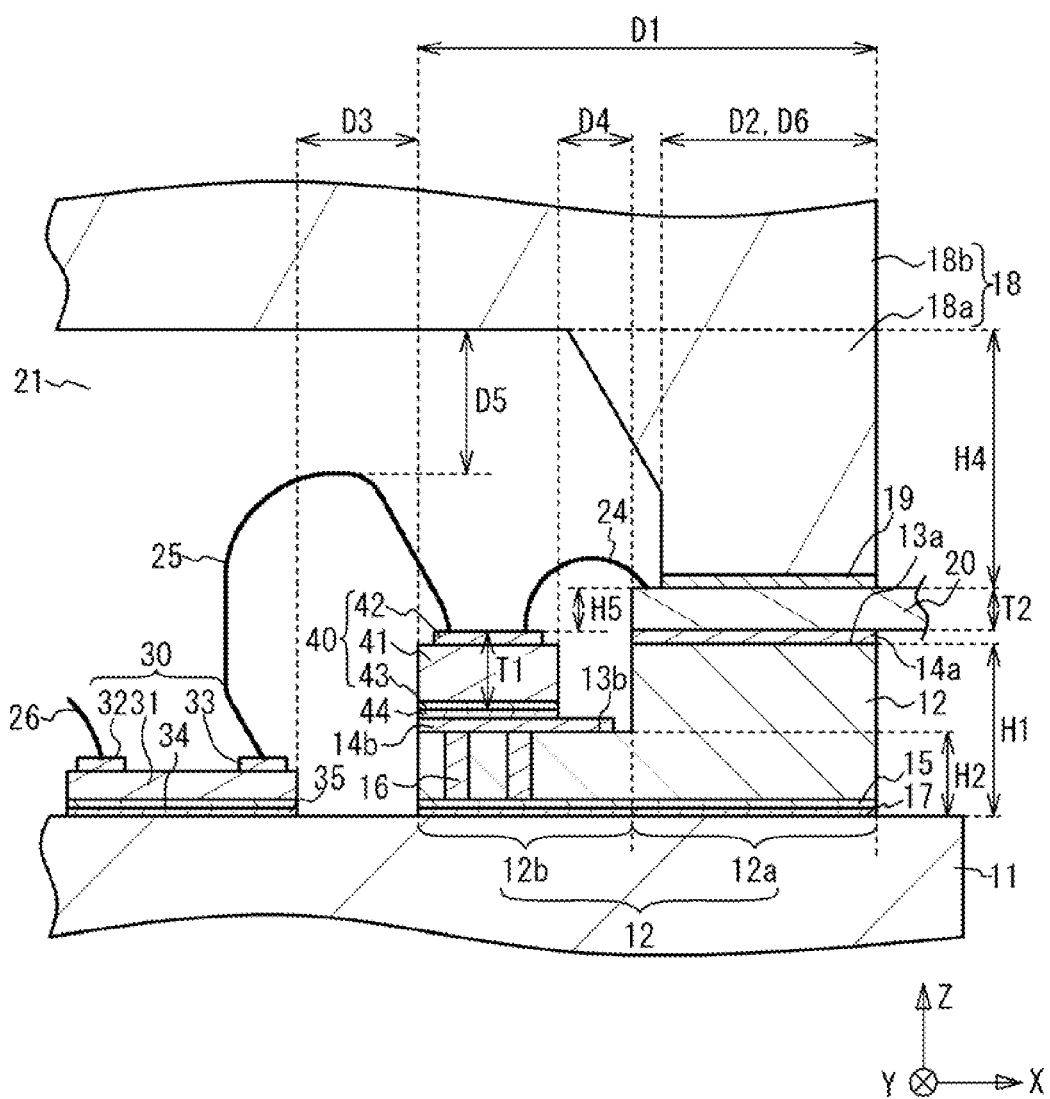
FIG. 3 is an enlarged view near a semiconductor chip and a capacitive component of FIG. 2.

FIG. 3 is an enlarged view near the semiconductor chip 30 and the capacitive component 40 of FIG. 2. As illustrated in FIG. 3, the frame 12 has a thick film section 12a and a thin film section 12b thinner than the thick film section 12a. The lower surfaces of the thick film section 12a and the thin film section 12b are substantially flat. The upper surfaces of the thick film section 12a and the thin film section 12b form a step. The upper surfaces of the thick film section 12a and the thin film section 12b are the upper surfaces 13a and 13b, respectively. The lower surface of the frame 12 is provided with a conductor pattern 15, and the conductor pattern 15 and the base substrate 11 are joined by a joining member 17. The joining member 17 is, for instance, a conductive wax material. The electrode 34 of the semiconductor chip 30 and the base substrate 11 are connected by a joining member 35. The electrode 43 of the capacitive component 40 and the conductor pattern 14b are joined by a joining member 44. The joining members 35 and 44 are conductive members obtained by sintering a metal paste such as a silver paste, for instance. The upper surface 13a of the frame 12 and the output lead 20, and the lateral section 18a of the cover 18 are joined by a joining member 19. The joining member 19 is, for instance, an insulating resin adhesive agent.

In FIG. 3 of Example 1, let H1 and H2 be the heights from the upper surface of the base substrate 11 to the upper surfaces 13a and 13b of the frame 12, respectively. The conductor patterns 14a, 14b, 15 and the joining member 17 are sufficiently thinner than the frame 12, thus the heights H1 and H2 are substantially the thicknesses of the thick film section 12a and the thin film section 12b. Let H4 be the height from the upper surface of the output lead 20 to the lower surface of the upper section 18b of the cover 18, D1 be the width of joint between the frame 12 and the base substrate 11, D2 be the width of joint of the lateral section 18a to the frame 12 and output lead 20, D3 be the distance between the frame 12 and the semiconductor chip 30, D4 be the distance between the thick film section 12a and the capacitive component 40, D5 be the distance between the lower surface of the cover 18 and the bonding wire 25, and D6 be the width of the lateral section 18a. As an example, H1, H2, H4, D1, D2, D3, D4, D5 and D6 are 0.5 mm, 0.25 mm, 0.8 mm, 1.25 mm, 0.55 mm, 0.3 mm, 0.2 mm, 0.43 mm and 0.6 mm, respectively.

Figure 4:
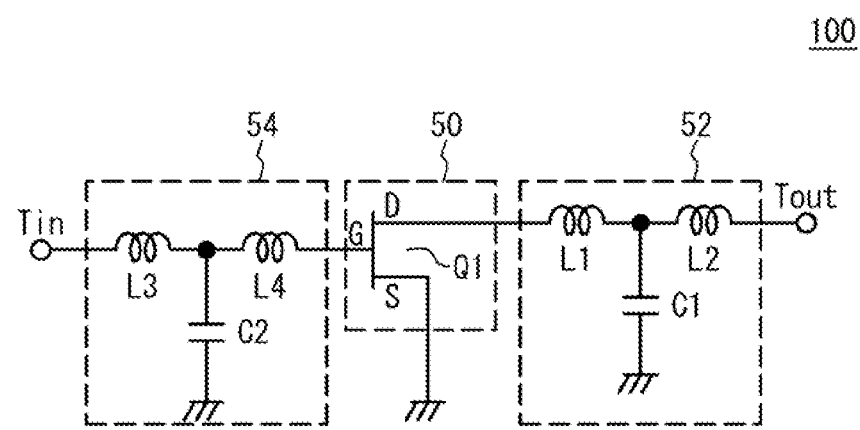
FIG. 4 is a circuit diagram of the semiconductor device according to Example 1.

FIG. 4 is a circuit diagram of the semiconductor device according to Example 1. As illustrated in FIG. 4, the semiconductor device 100 is a high output amplifier circuit, and includes an amplifier 50, an output matching circuit 52 and an input matching circuit 54. For instance, the amplifier 50 includes a transistor Q1 such as an FET. The transistor Q1 is, for instance, a gallium nitride high electron mobility transistor (GaNHEMT) or a laterally diffused metal oxide semiconductor (LDMOS). Source S of the transistor Q1 is connected to the ground, gate G is connected to an input terminal Tin through the input matching circuit 54, and drain D is connected to an output terminal Tout through the output matching circuit 52. The amplifier 50 corresponds to the semiconductor chip 30, and the source S, the gate G and the drain D correspond to the electrodes 34, 32 and 33, respectively.

The output matching circuit 52 includes inductors L1, L2 and a capacitor C1. The inductors L1 and L2 are connected in series between the drain D and the output terminal Tout. One end of the capacitor C1 is connected to a node between the inductors L1 and L2, and the other end is connected to the ground. The inductors L1, L2 and the capacitor C1 correspond to the bonding wires 25, 24 and the capacitive component 40, respectively. The output matching circuit 52 matches the output impedance of the amplifier 50 to the output impedance of the output terminal Tout.

The input matching circuit 54 includes inductors L3, L4 and a capacitor C2. The inductors L3 and L4 are connected in series between the gate G and the input terminal Tin. One end of the capacitor C2 is connected to a node between the inductor L3 and L4, and the other end is connected to the ground. The inductors L3, L4 and the capacitor C2 correspond to the bonding wires 27, 26 and the capacitive component 45, respectively. The input matching circuit 54 matches the input impedance of the amplifier 50 to the input impedance of the input terminal Tin.

For instance, the amplifier circuit is a 3.3 GHz to 3.8 GHz power amplifier circuit, and a high-frequency signal input from the input terminal Tin is amplified by the amplifier 50 and output from the output terminal Tout.

Comparative Example 1

Figure 5:
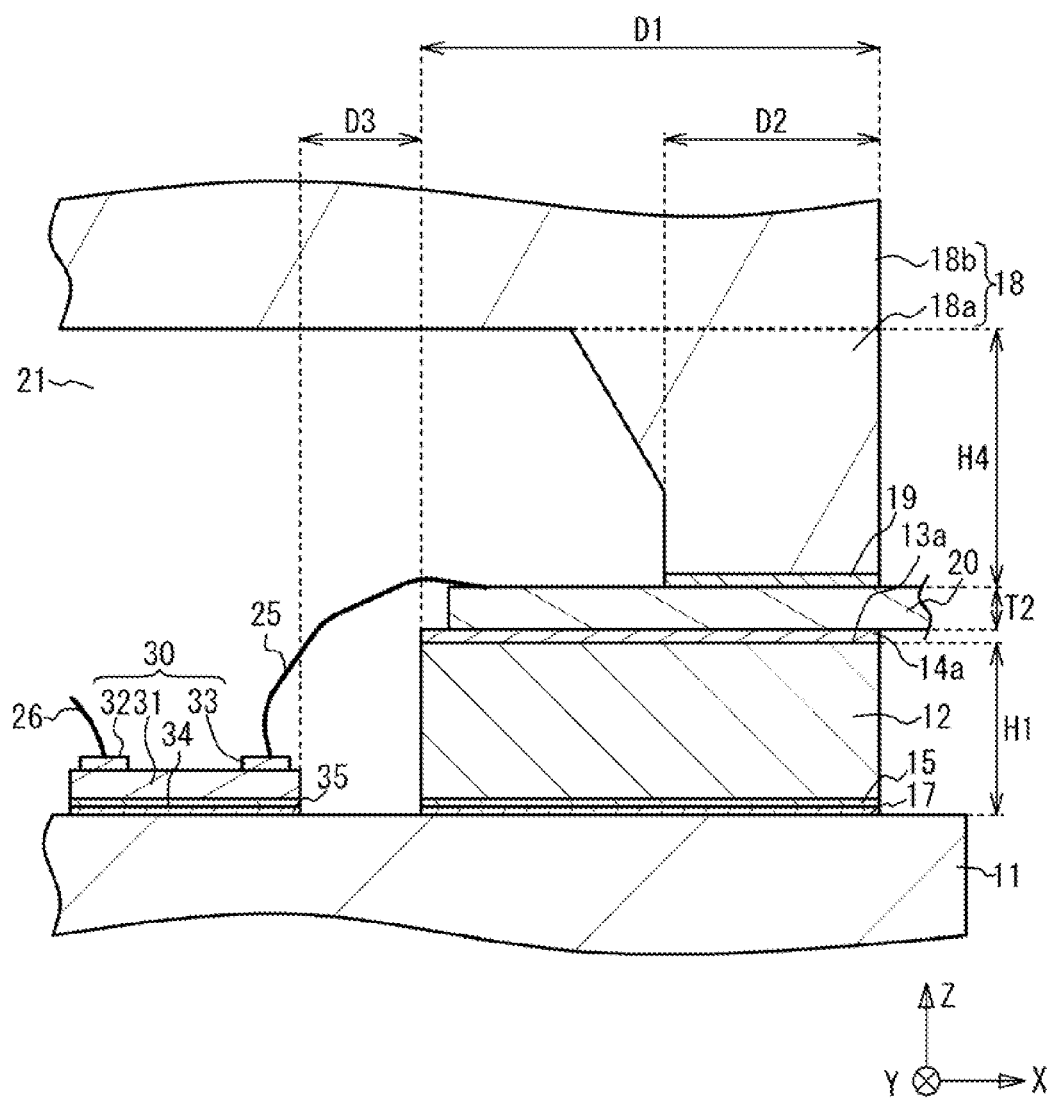
FIG. 5 is an enlarged cross-sectional view of a semiconductor device according to Comparative Example 1.

FIG. 5 is an enlarged cross-sectional view of a semiconductor device according to Comparative Example 1. As illustrated in FIG. 5, the capacitive component 40 is not provided in the package. In other words, the internal output matching circuit is not provided. The frame 12 is not formed in a step shape, and the upper surface 13a of the frame 12 is provided with the output lead 20. The bonding wire 25 electrically connects the electrode 33 of the semiconductor chip 30 and the output lead 20. To secure the joint between the base substrate 11 and the frame 12 by the joining member 17, the width D1 is required to be a predetermined value or more according to the design rule. In contrast, the width D2 of joint of the lateral section 18a to the frame 12 and output lead 20 is not required to be as large as D1. This is because a resin-based insulating adhesive agent can be used for the joining member 19, whereas a conductive wax material is used for the joining member 17. In addition, the base substrate 11 is, for instance, a metal layer, and the frame 12 is an insulator, thus the difference in coefficients of thermal expansion is likely to increase, and thermal stress tends to be applied to between the base substrate 11 and the frame 12. According to a design rule, D1 is 1.55 mm. H1, H4, D2 and D3 are, for instance, 0.5 mm, 0.8 mm, 0.6 mm and 0.3 mm.

In Comparative Example 1, the semiconductor chip 30 and the output lead 20 are connected using the bonding wire 25. Because the output impedance of the semiconductor chip 30 is very low, in Comparative Example 1, the output impedance of the output lead 20 becomes low. Therefore, it is difficult to improve the characteristics of the amplifier circuit. It is preferable that an internal matching circuit be provided between the semiconductor chip 30 and the output lead 20. However, in order to provide an internal matching circuit in the base package, the capacitive component 40 has to be mounted on the base substrate 11, which increases the size of the semiconductor device.

Comparative Example 2

Figure 6:
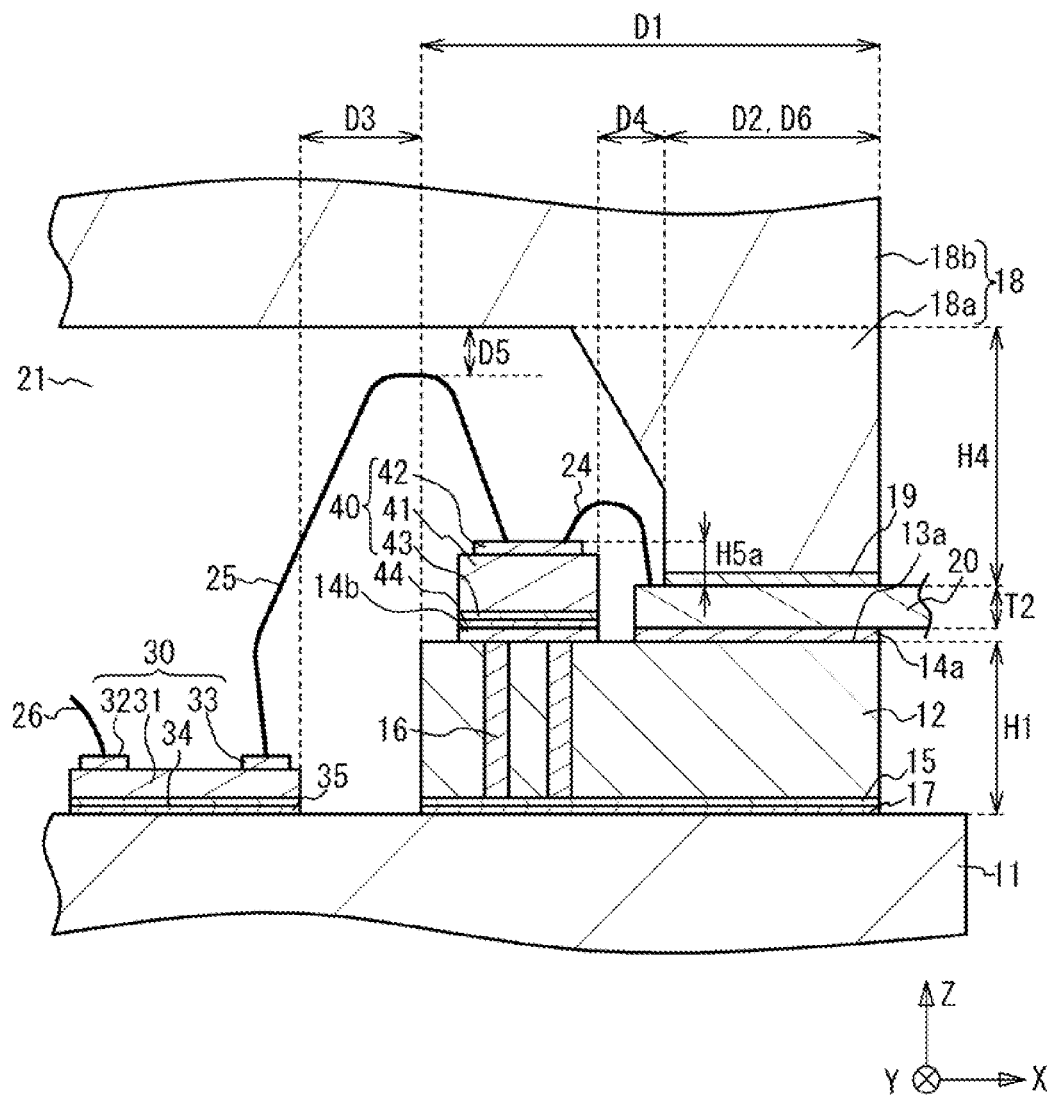
FIG. 6 is an enlarged cross-sectional view of a semiconductor device according to Comparative Example 2.

FIG. 6 is an enlarged cross-sectional view of a semiconductor device according to Comparative Example 2. As illustrated in FIG. 6, in Comparative Example 2, the conductor pattern 14b is provided on the frame 12. The conductor pattern 14b is electrically separated from the conductor pattern 14a. The conductor pattern 14b is electrically connected to the base substrate 11 via the through electrode 16. In Comparative Example 1, mounting the capacitive component 40 on the frame 12 allows the capacitive component 40 to be mounted within the package without increasing the width of the base substrate 11 in the X-direction. Providing the bonding wires 24 and 25 allows the output matching circuit 52 of FIG. 4 to be mounted within the package. Consequently, the semiconductor device can be downsized. The reason why the capacitive component 40 can be mounted on the frame 12 is that the width D2 of joint between the lateral section 18a of the cover 18 and the frame 12 may be smaller than the width D1 of joint between the frame 12 and the base substrate 11.

In the case where 3.3 GHz to 3.8 GHz amplifier circuit is used, examples of the inductance of the inductor L1 and the capacitance of the capacitor C1 of the output matching circuit 52 in FIG. 4 are 0.387 nH and 8 pF, respectively. When impedance matching is made mainly by the inductor L1 and the capacitor C1, the inductance of the inductor L2 is reduced to 0.15 nH. The inductance of 0.387 nH of the inductor L1 can be achieved by setting the length of each bonding wire 25 to 1.76 mm, the number of bonding wires 25 to 16, and the space between the bonding wires 25 to 0.25 mm. Note that the inductance is affected not only by the length of the bonding wire 25, but also by the shape of the bonding wire 25. The capacitance of 8 pF of the capacitor C1 can be achieved by setting the dielectric constant of the dielectric substrate 41 to 250, the thickness thereof to 0.25 mm, the outer shape of the dielectric substrate 41 to 3.5 mm×0.4 mm, and the shape of the electrode 42 to 3.4 mm×0.3 mm. To reduce the inductance of the inductor L2, the length of the bonding wire 24 is shortened, and the number of bonding wires is increased.

When the distance D3 between the semiconductor chip 30 and the frame 12 is set to the smallest value according to a design rule to downsize the semiconductor device, and the length of each bonding wire 25 is set to 1.76 mm to obtain a desired inductance as the inductor L1, the distance D5 between the bonding wire 25 and the lower surface of the upper section 18b of the cover 18 is reduced to 0.2 mm, for instance. After the bonding wire 25 is formed, the cover 18 is joined onto the frame 12. At this point of time, when the bonding wire 25 interferes (for instance, contacts) with the lower surface of the upper section 18b, the shape of the bonding wire 25 is changed. Therefore, the inductance of the inductor L1 is changed. Consequently, the characteristics of the output matching circuit 52 are changed, and a desired performance of the amplifier circuit may not be obtained.

In order to reduce the interference between the bonding wire 25 and the lower surface of the upper section 18b of the cover 18, the height of the lower surface of the upper section 18b from the base substrate 11 may be increased. However, as a consequence, the height of the package increases, and the semiconductor device will increase in size. The frame 12 may be thinned. However, when the frame 12 is thinned, the distance is reduced between the output lead 20 and the base substrate 11 to which the ground potential is supplied, which affects the propagation characteristics of high-frequency signal of the output lead 20.

In addition, in Comparative Example 2, when the electrode 42 of the capacitive component 40 is higher than the upper surface of the output lead 20, the distance D4 between the lateral section 18a of the cover 18 and the capacitive component 40 is reduced to shorten the bonding wire 24. The distance D4 is, for instance, 0.14 mm. When the capacitive component 40 is mounted and the cover 18 is joined to the frame 12, the distance D4 as a margin according to a design rule is, for instance, 0.2 mm, which cannot satisfy the above-mentioned design rule.

According to Example 1, as in FIG. 3, the semiconductor chip 30 having the electrode 33 (signal pad) is mounted on the base substrate 11. The frame 12 surrounds the semiconductor chip 30, and is mounted on the base substrate 11. The frame 12 has a step having the inner upper surface 13b (the first upper surface) and the outer upper surface 13a (the second upper surface) higher than the upper surface 13b in a plan view. The conductor pattern 14b (the first conductor pattern) provided on the upper surface 13b is electrically connected to the base substrate 11. The capacitive component 40 is mounted on the conductor pattern 14b, and the output lead 20 and the conductor pattern 14a are mounted on the upper surface 13a of frame 12. The bonding wire 25 (the first bonding wire) electrically connects the electrode 33 and the upper surface of the capacitive component 40, and the bonding wire 24 (the second bonding wire) electrically connects the upper surface of the capacitive component 40 and the output lead 20. The cover 18 is joined to the upper surface 13a of the frame 12, and seals the semiconductor chip 30 in the space 21.

Thus, the capacitive component 40 is disposed at a position with a height, closer to the base substrate 11 than in Comparative Example 2. Thus, the distance D5 between the lower surface of the upper section 18b of the cover 18 and the bonding wire 25 can be increased. For instance, D5 can be set to approximately 0.43 mm. Consequently, the cover 18 does not interfere with the bonding wire 25, the characteristics of the output matching circuit 52 are not changed, and the semiconductor device can be downsized.

The bonding wire 24 is directly joined to the upper surface of the output lead 20. Thus, the bonding wire 24 can be shortened. In addition, appropriate setting of the height H2 of the upper surface 13b allows the height difference H5 between the upper surface of the electrode 42 of the capacitive component 40 and the upper surface of output lead 20 to be lower than the height difference H5a between the upper surfaces of the electrode 42 of the capacitive component 40 and the output lead 20 in Comparative Example 2. Thus, even when the distance D4 between the capacitive component 40 and the lateral section 18a is set to, for instance, 0.2 mm, which is a design rule, the length of the bonding wire 24 can be approximately the same as in FIG. 6 of Comparative Example 2. The conductor patterns 14a, 14b and the joining member 44 are sufficiently thinner than the capacitive component 40 and the output lead 20. At this point, in order to set the height difference H5 of FIG. 3 in Example 1 lower than the height difference H5a in Comparative Example 2, it is preferable that the height difference H5 be smaller than the difference between thickness T1 of the capacitive component 40 and thickness T2 of the output lead 20. It is more preferable that the height difference H5 be smaller than ½ or less of the difference between the thicknesses T1 and T2.

Modification 1 of Example 1

Figure 7:
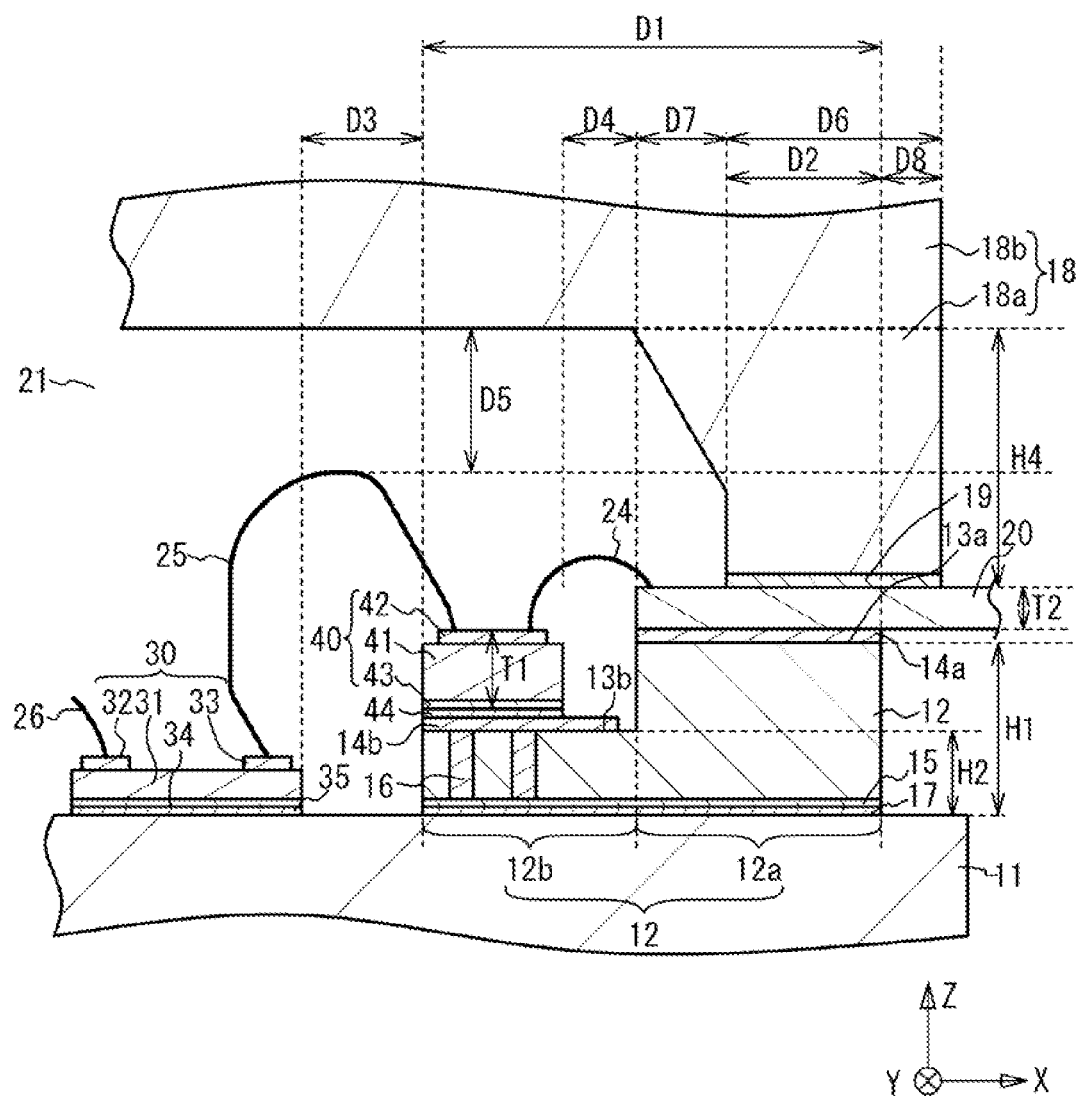
FIG. 7 is an enlarged cross-sectional view of a semiconductor device according to Modification 1 of Example 1.

FIG. 7 is an enlarged cross-sectional view of a semiconductor device according to Modification 1 of Example 1. As illustrated in FIG. 7, width D6 of the lateral section 18a of the cover 18 is the same as in FIG. 3 of Example 1. The outer lateral face of the lateral section 18a is positioned outwardly of the outer lateral face of the frame 12 by distance D8. The distance D8 is, for instance, 0.2 mm. Thus, the distance D7 between the inner end face of the thick film section 12a and the inner lateral face of the lateral section 18a can be increased. The distance D7 is, for instance, 0.25 mm. The width D2 of joint of the lateral section 18a to the frame 12 and the output lead 20 becomes smaller than in Example 2. When the joint strength between the lateral section 18a and the frame 12 is sufficient, the width D2 may be reduced. Other components are the same as those in Example 1, and a description is omitted.

In FIG. 3 of Example 1, the distance between the inner lateral face of the lateral section 18a and the bonding wire 24 is small, thus when the cover 18 is joined to the frame 12 and the output lead 20, the bonding wire 24 may be broken. In Modification 1 of Example 1, the lateral section 18a is disposed more outwardly than in Example 1, thus the distance D7 can be increased. In other words, the area on the output lead 20 for joining the bonding wire 24 can be expanded. Thus, breakage of the bonding wire 24 can be prevented. In addition, the strength of the lateral section 18a can be maintained by setting the width D6 of the lateral section 18a equal to that in FIG. 3 of Example 1.

Modification 2 of Example 1

Figure 8:
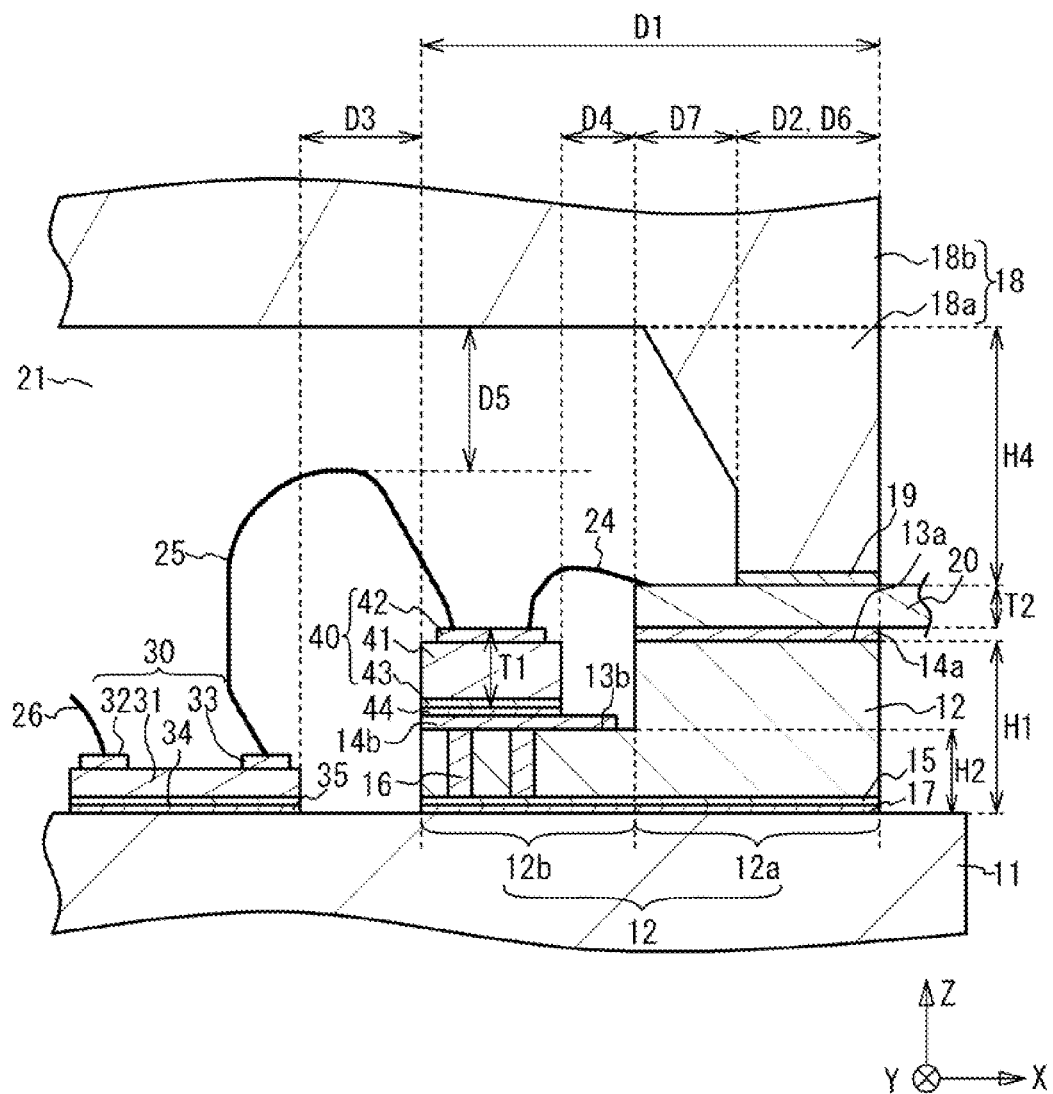
FIG. 8 is an enlarged cross-sectional view of a semiconductor device according to Modification 2 of Example 1.

FIG. 8 is an enlarged cross-sectional view of a semiconductor device according to Modification 2 of Example 1. As illustrated in FIG. 8, in Modification 2 of Example 1, in contrast to Modification 1 of Example 1, the width D6 of the lateral section 18a is reduced to the same level as the width D2. Other components are the same as those in Modification 1 of Example 1, and a description is omitted. In Modification 2 of Example 1, breakage of the bonding wire 24 can be prevented as in Modification 1 of Example 1. Furthermore, the outer lateral face of the lateral section 18a substantially matches the outer lateral face of the frame 12. Consequently, in contrast to FIG. 7 of Modification 1 of Example 1, the outer shape of the semiconductor device can be downsized to be approximately the same as in Example 1.

Modification 3 of Example 1

Figure 9:
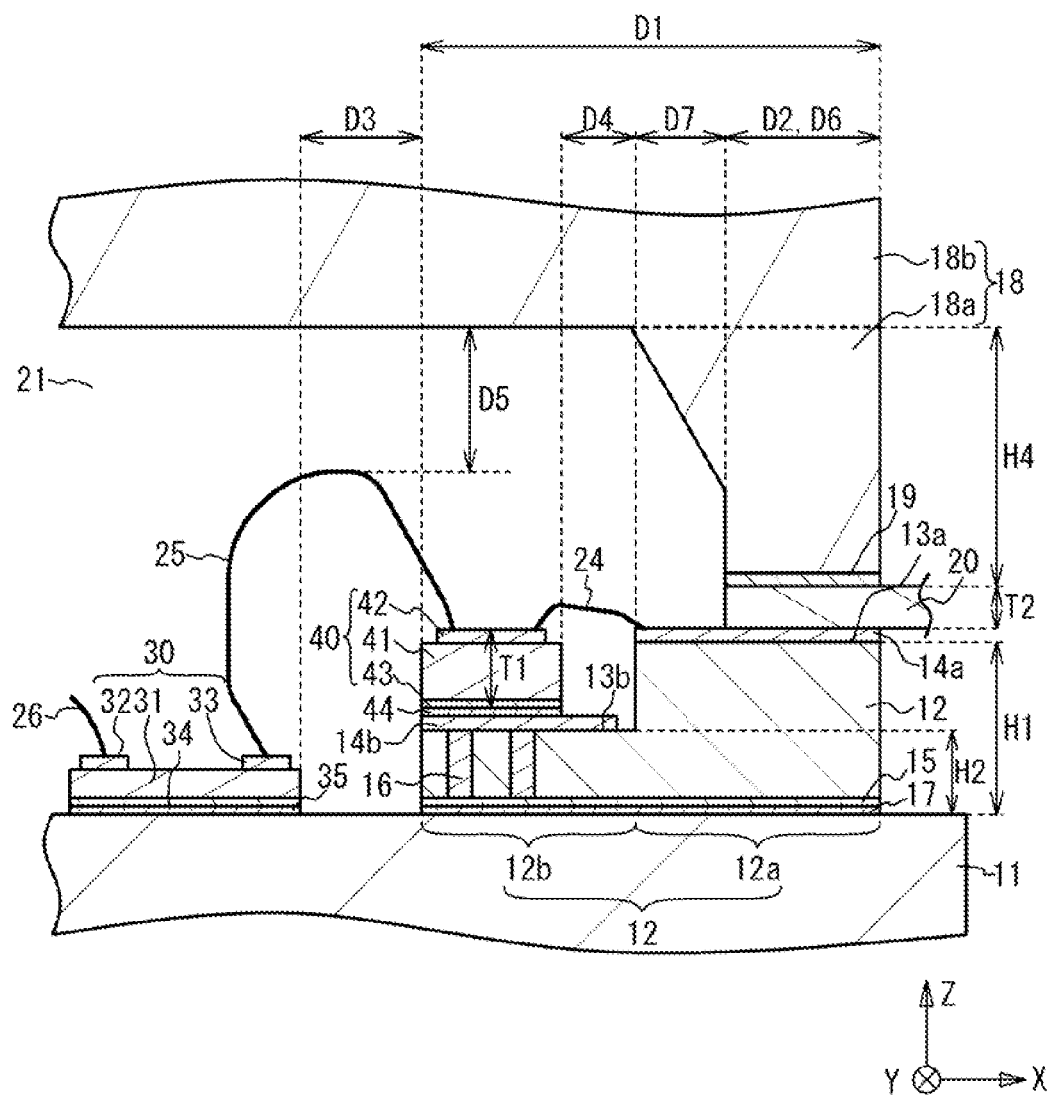
FIG. 9 is an enlarged cross-sectional view of a semiconductor device according to Modification 3 of Example 1.

FIG. 9 is an enlarged cross-sectional view of a semiconductor device according to Modification 3 of Example 1. In Modification 3 of Example 1, in contrast to Modification 2 of Example 1, the position of the output lead 20 is moved outwardly so that the position of the inner end face of the output lead 20 is approximately the same as the position of the inner lateral face of the lateral section 18a of the cover 18. As a result, as illustrated in FIG. 9, the bonding wire 24 is joined to the conductor pattern 14a. Other components are the same as those in Modification 2 of Example 1, and a description is omitted. As in Modification 3 of Example 1, the bonding wire 24 may be joined to the conductor pattern 14a. The conductor pattern 14a and the output lead 20 function as output terminals.

In Example 1 and its Modifications 1 to 3, the bonding wire 24 is joined to the output lead 20 or the conductor pattern 14a (in other words, the signal terminal). Thus, the capacitive component 40 and the output terminal can be electrically connected. The lateral section 18a of the cover 18 is joined to the output lead 20 outwardly in a plan view of a position at which the bonding wire 24 is joined to the output lead 20 or the conductor pattern 14a. Consequently, when the cover 18 is joined to the frame 12, the bonding wire 24 can be prevented from being broken. As in Modifications 1 to 3 of Example 1, the distance D7 between the inner end face of the thick film section 12a and the inner lateral face of the lateral section 18a is preferably ¼ or more of the width of the thick film section 12a. Thus, it is possible to secure the area where the bonding wire 24 is joined to the output lead 20 or the conductor pattern 14a.

Modification 4 of Example 1

Figure 10:
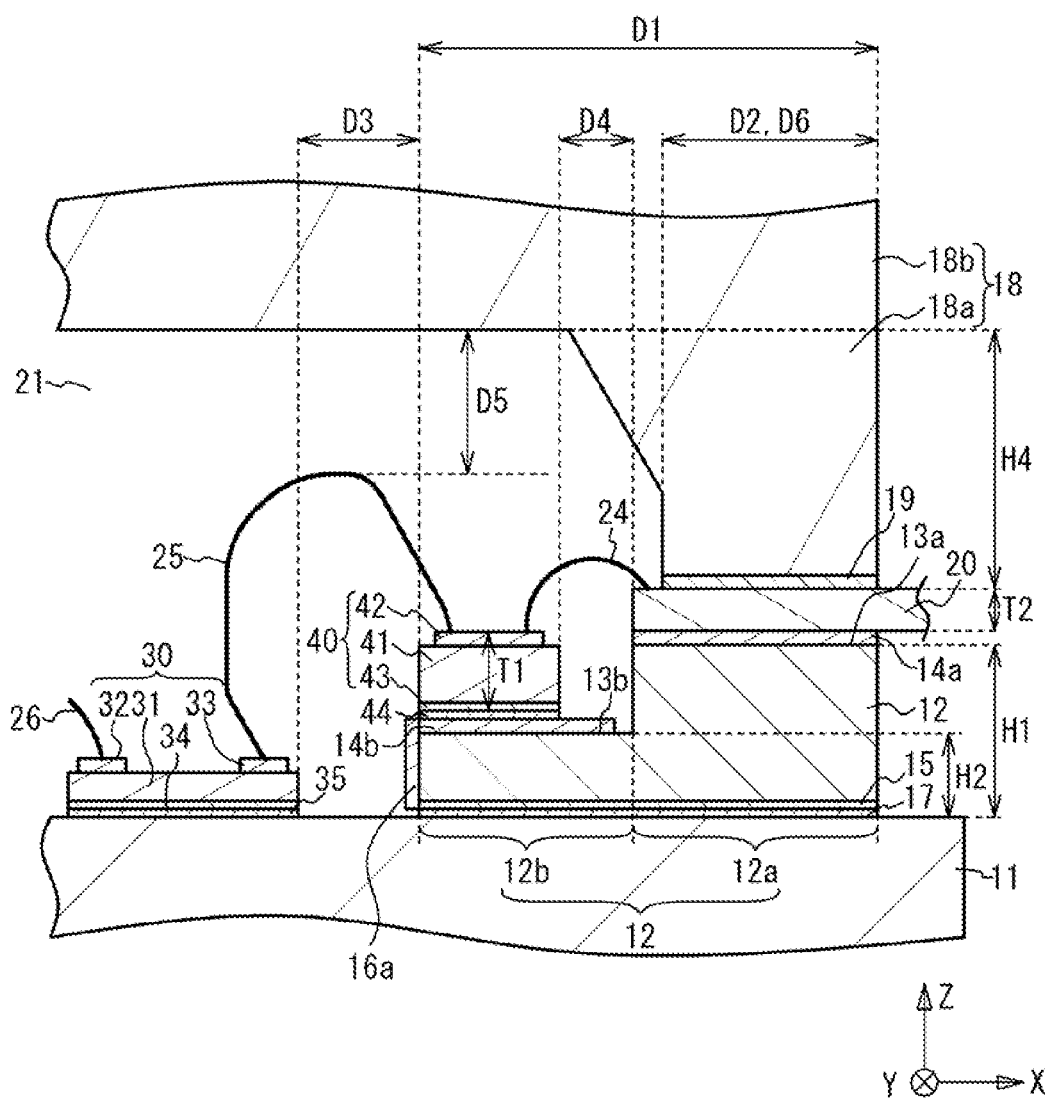
FIG. 10 is an enlarged cross-sectional view of a semiconductor device according to Modification 4 of Example 1.

FIG. 10 is an enlarged cross-sectional view of a semiconductor device according to Modification 4 of Example 1. As illustrated in FIG. 10, the through electrode 16 is not provided, and a conductor layer 16a is provided on the inner lateral face of the thin film section 12b. The conductor layer 16a electrically connects the conductor pattern 14a and the conductor pattern 15. Other components are the same as those in Example 1, and a description is omitted.

As in Example 1 and its Modifications 1 to 4, the conductor pattern 14b and the base substrate 11 are electrically connected by the through electrode 16 penetrating the thin film section 12b of the frame 12 or another conductor layer 16a provided on the inner lateral face of the thin film section 12b of the frame 12. Thus, the conductor pattern 14b and the base substrate 11 can be electrically connected easily. As a result, the electrode 43 on the lower surface of the capacitive component 40 mounted on the thin film section 12b of the frame 12 can be easily connected electrically to the base substrate 11 via the joining member 44.

Modification 5 of Example 1

Figure 11:
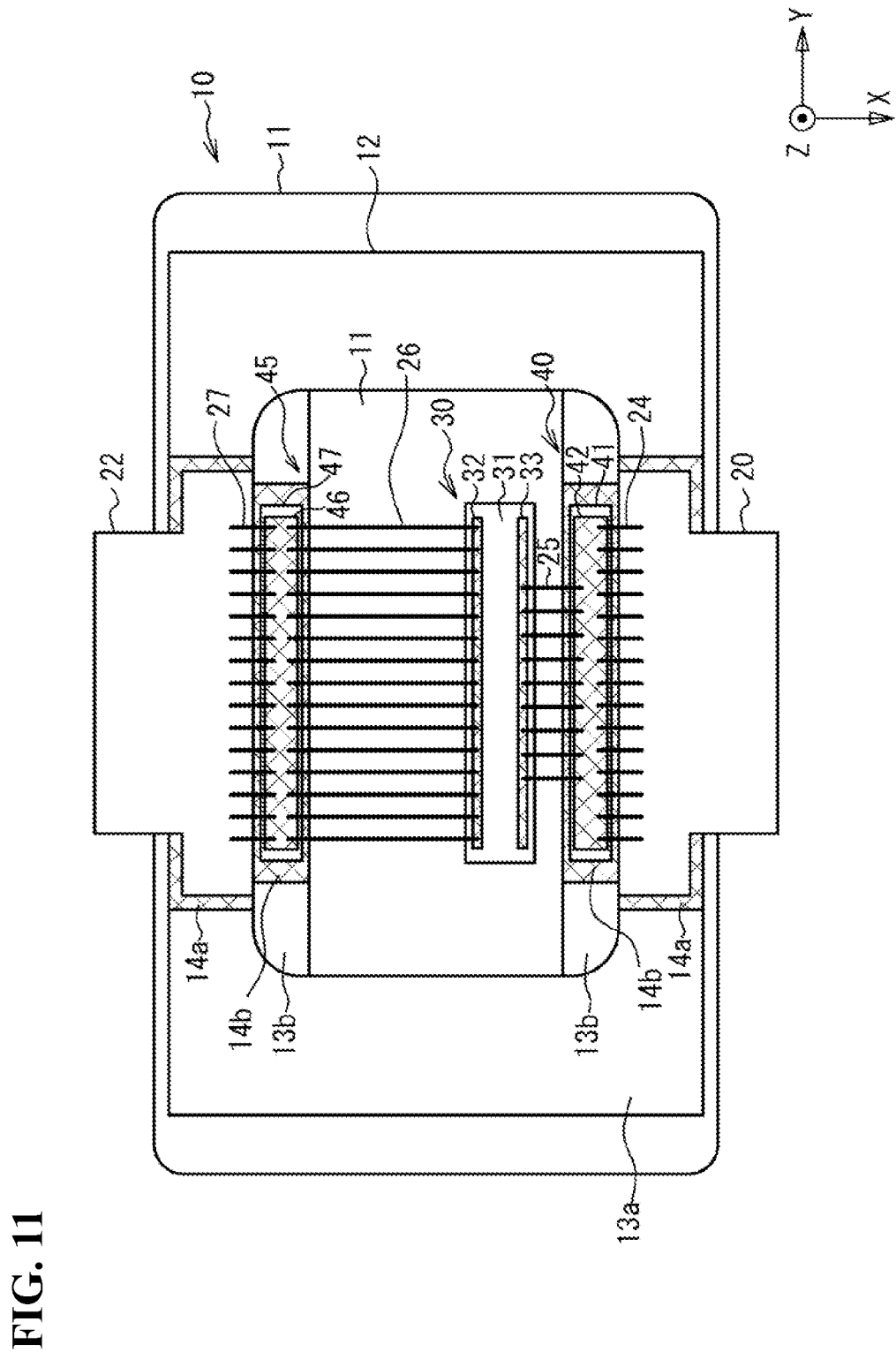
FIG. 11 is a plan view of a semiconductor device according to Modification 5 of Example 1.

FIG. 11 is a plan view of a semiconductor device according to Modification 5 of Example 1. As illustrated in FIG. 11, the capacitive component 45 is mounted on the upper surface 13b of the frame 12 on the input lead 22 (−X) side. The electrode 48 (not illustrated) of the capacitive component 45 is connected to the base substrate 11 via a through electrode penetrating the conductor pattern 14b and the frame 12. Other components are the same as those in Example 1, and a description is omitted. As in Modification 5 of Example 1, the capacitive component 45 corresponding to the capacitor C2 of the input matching circuit 54 may also be mounted on the upper surface 13b. Like this, the signal pad of the semiconductor chip 30 connected to the capacitive component 40 or 45 is at least one of the electrode 32 (input pad) via which a high-frequency signal is input to the transistor and the electrode 33 (output pad) via which a high-frequency signal is output from the transistor. [Modification 6 of Example 1]

Figure 12:
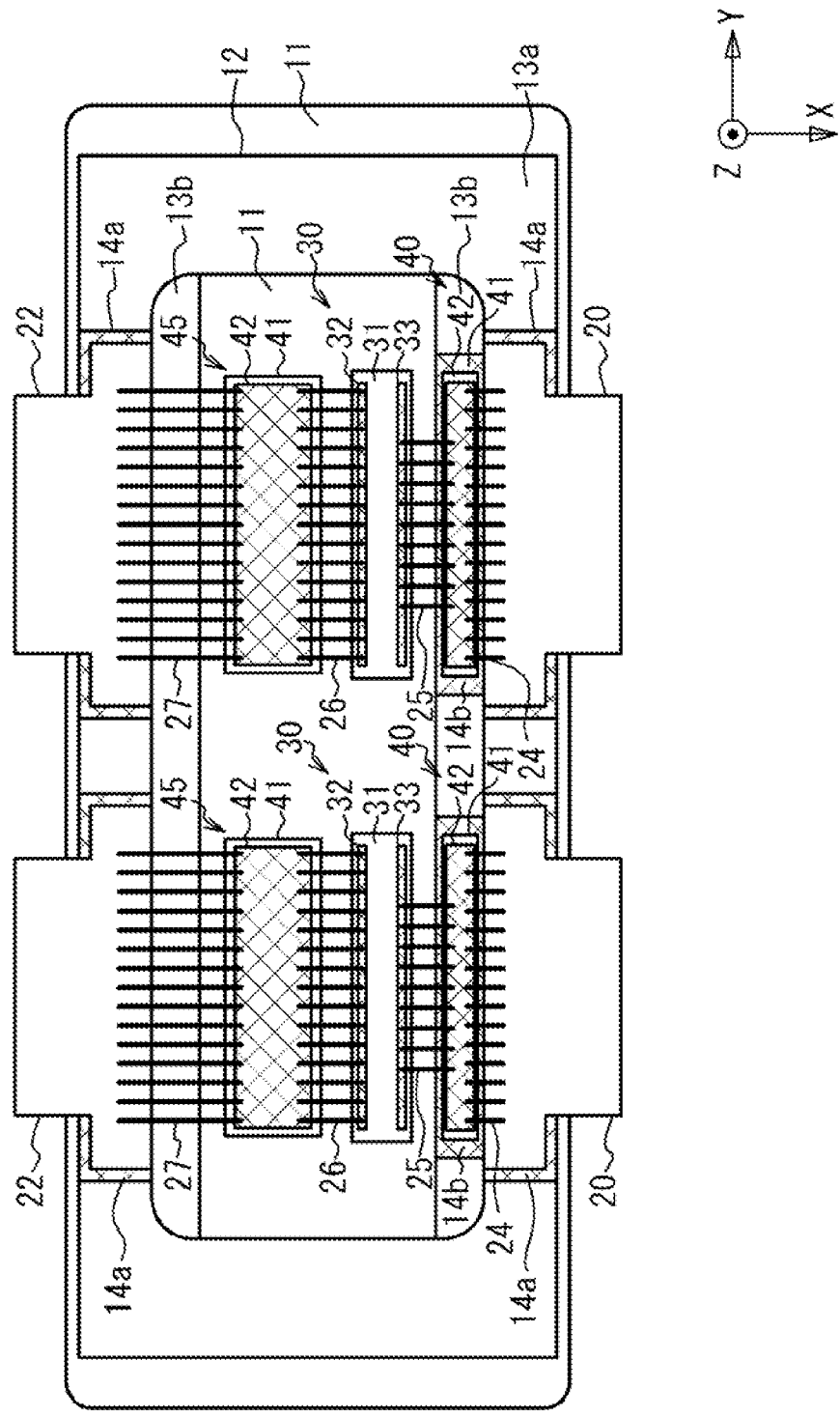
FIG. 12 is a plan view of a semiconductor device according to Modification 6 of Example 1.

FIG. 12 is a plan view of a semiconductor device according to Modification 6 of Example 1. As illustrated in FIG. 12, two semiconductor chips 30 and two capacitive components 45 are mounted on the base substrate 11, and two capacitive components 40 are mounted on the upper surface 13b of the thin film section 12b of the frame 12. Two input leads 22 and two output leads 20 are provided on the upper surface 13a of the thick film section 12a of the frame 12. The two semiconductor chips 30 correspond to a carrier amplifier and a peak amplifier of a Doherty amplifier circuit, for instance. Other components are the same as those in Example 1, and a description is omitted. The semiconductor device may be provided with multiple semiconductor chips 30 and capacitive components 40.

Example 2

Figure 13:
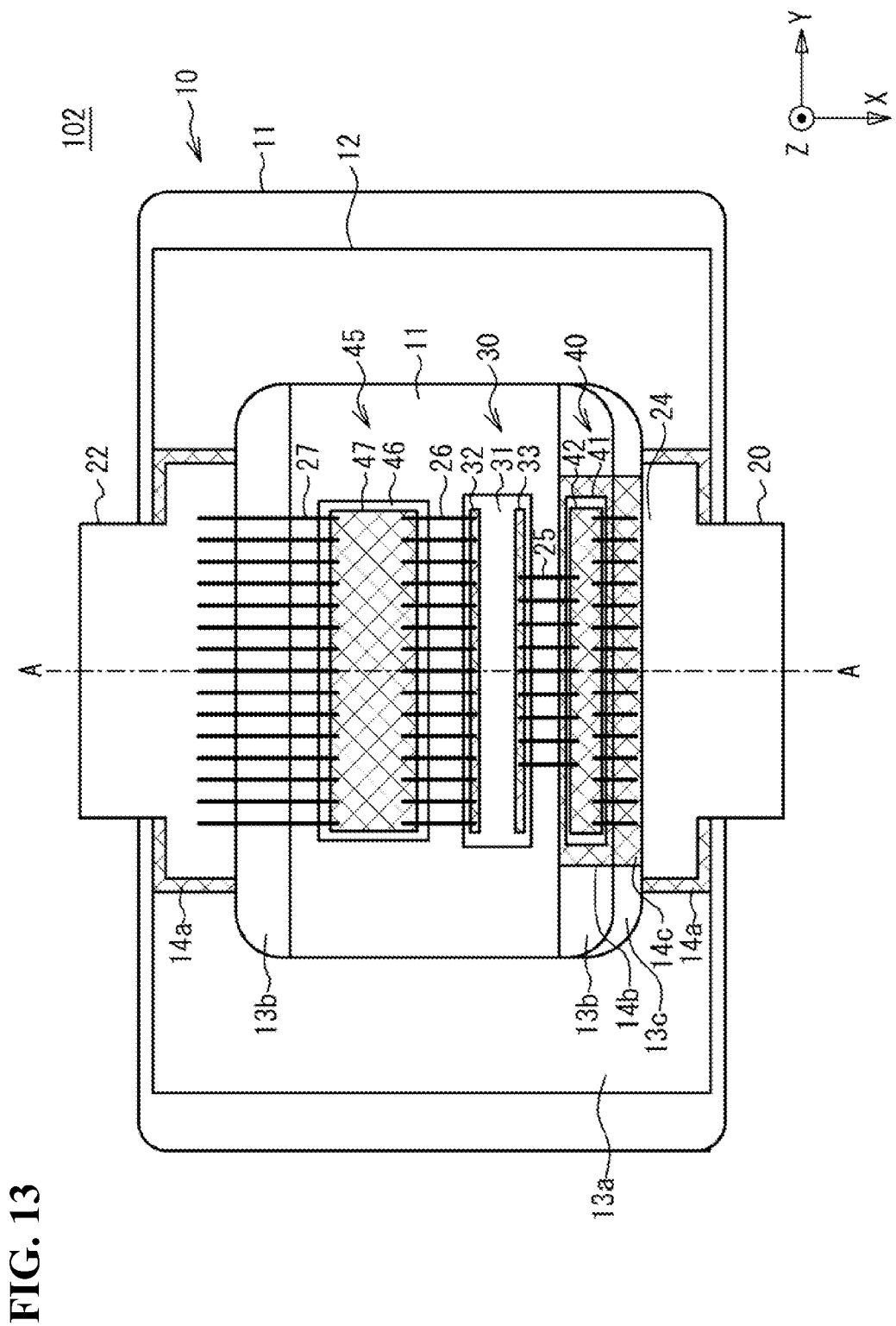
FIG. 13 is a plan view of a semiconductor device according to Example 2.
Figure 14:
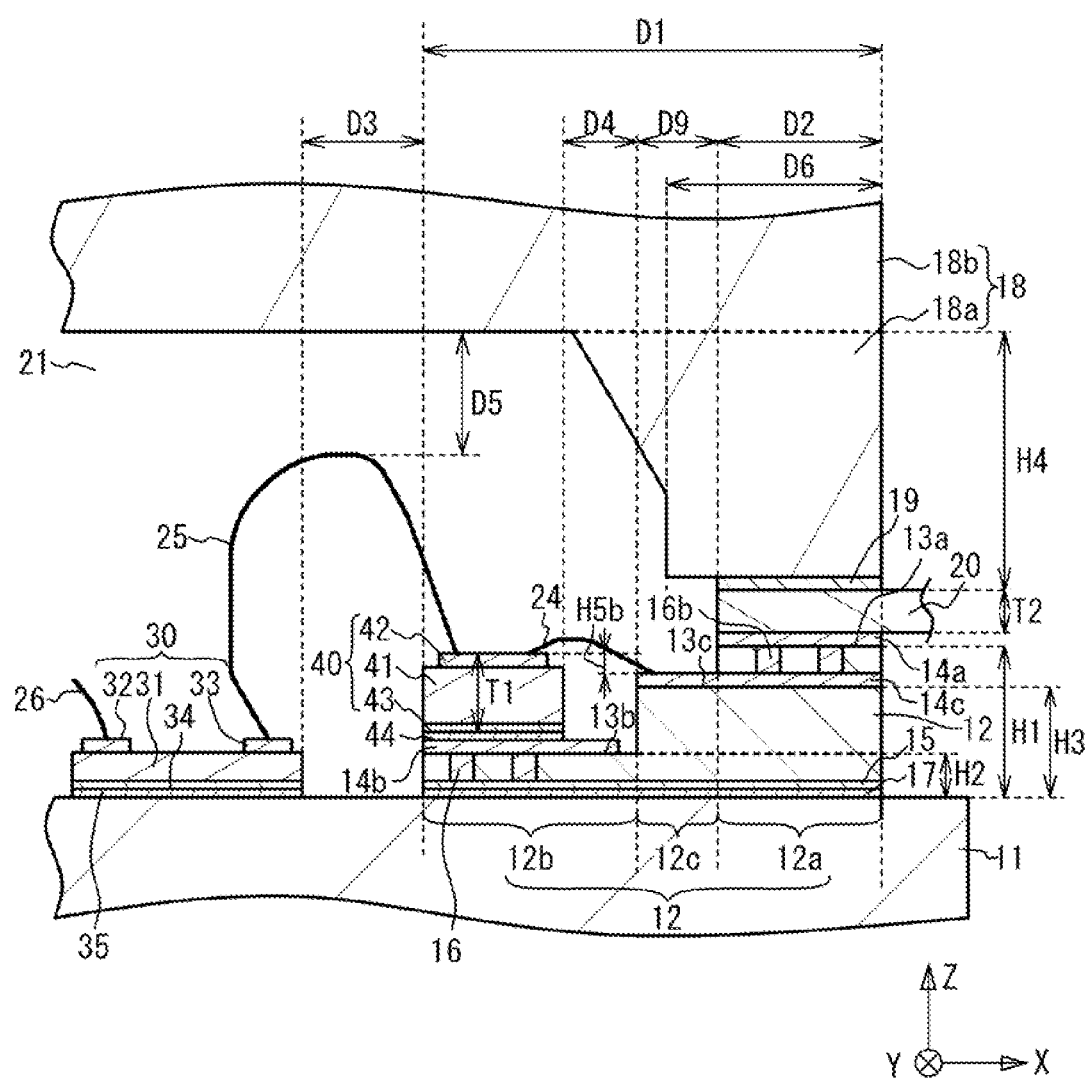
FIG. 14 is an enlarged view near a semiconductor chip and a capacitive component in Example 2.

FIG. 13 is a plan view of a semiconductor device according to Example 2. FIG. 14 is an enlarged view near the semiconductor chip 30 and the capacitive component 40 in Example 2. As illustrated in FIG. 13 and FIG. 14, in a semiconductor device 102, the frame 12 has an intermediate section 12c between the thin film section 12b and the thick film section 12a. The intermediate section 12c is thicker than the thin film section 12b and thinner than the thick film section 12a. An upper surface 13c of the intermediate section 12c is provided with a conductor pattern 14c. The conductor pattern 14c extends into the thick film section 12a. The conductor patterns 14a and 14c are electrically connected and short-circuited by an internal wire 16b in the thick film section 12a. The conductor patterns 14a and 14c have the same potential. The bonding wire 24 is joined to the conductor pattern 14c. The height of the upper surface 13c of the intermediate section 12c from the base substrate 11 is H3. H1, H2 and H3 are, for instance, 0.5 mm, 0.125 mm and 0.375 mm. The distance D9 between the inner lateral face of the thick film section 12a and the inner lateral face of the intermediate section 12c is, for instance, 0.2 mm. Other components are the same as those in Example 1, and a description is omitted.

According to Example 2, the step has the upper surface 13c (third upper surface) of the intermediate section 12c between the upper surface 13a of the thick film section 12a and the upper surface 13b of the thin film section 12b in a plan view, the upper surface 13c being higher than the upper surface 13b and lower than the upper surface 13a. The conductor pattern 14c (the second conductor pattern) is provided on the upper surface 13c of the intermediate section 12c. The conductor pattern 14c is electrically connected to the output lead 20 (signal terminal) via the internal wire 16b. The bonding wire 24 is joined to the conductor pattern 14c, and is electrically connected to the output lead 20 via the conductor pattern 14c, the internal wire 16b, and the conductor pattern 14a.

Thus, the position at which the capacitive component 40 is mounted can be lowered as compared to FIG. 3 of Example 1. Thus, the distance D5 between the lower surface of the upper section 18b of the cover 18 and the bonding wire 25 can be increased. Consequently, the interference between the upper section 18b of the cover 18 and the bonding wire 25 can be prevented.

Even when the height H2 of the upper surface 13b, on which the capacitive component 40 is mounted, of the thin film section 12b is lower than that in Example 1, it is possible to reduce the height difference H5b between the upper surface of the electrode 42 of the capacitive component 40 and the upper surface of the conductor pattern 14c. Thus, even when the length of the bonding wire 24 is made approximately the same as in Comparative Example 2, it is possible to secure the distance D4 between the lateral face of the capacitive component 40 and the inner lateral face of the intermediate section 12c. Thus, the semiconductor device can be downsized. The conductor patterns 14a to 14c and the joining member 44 are sufficiently thinner than the frame 12, the capacitive component 40 and the output lead 20. At this point, in order to set the height difference H5b of FIG. 14 in Example 2 lower than the height difference H5 in Example 1, the height difference H5b is preferably smaller than the difference between the thickness T1 of the capacitive component 40 and the height difference (H1−H2) between the upper surface 13b of the thin film section 12b and the upper surface 13a of the thick film section 12a. It is more preferable that the height difference H5b be ½ or less of the difference between the thickness T1 and the difference (H1−H2).

Modification 1 of Example 2

Figure 15:
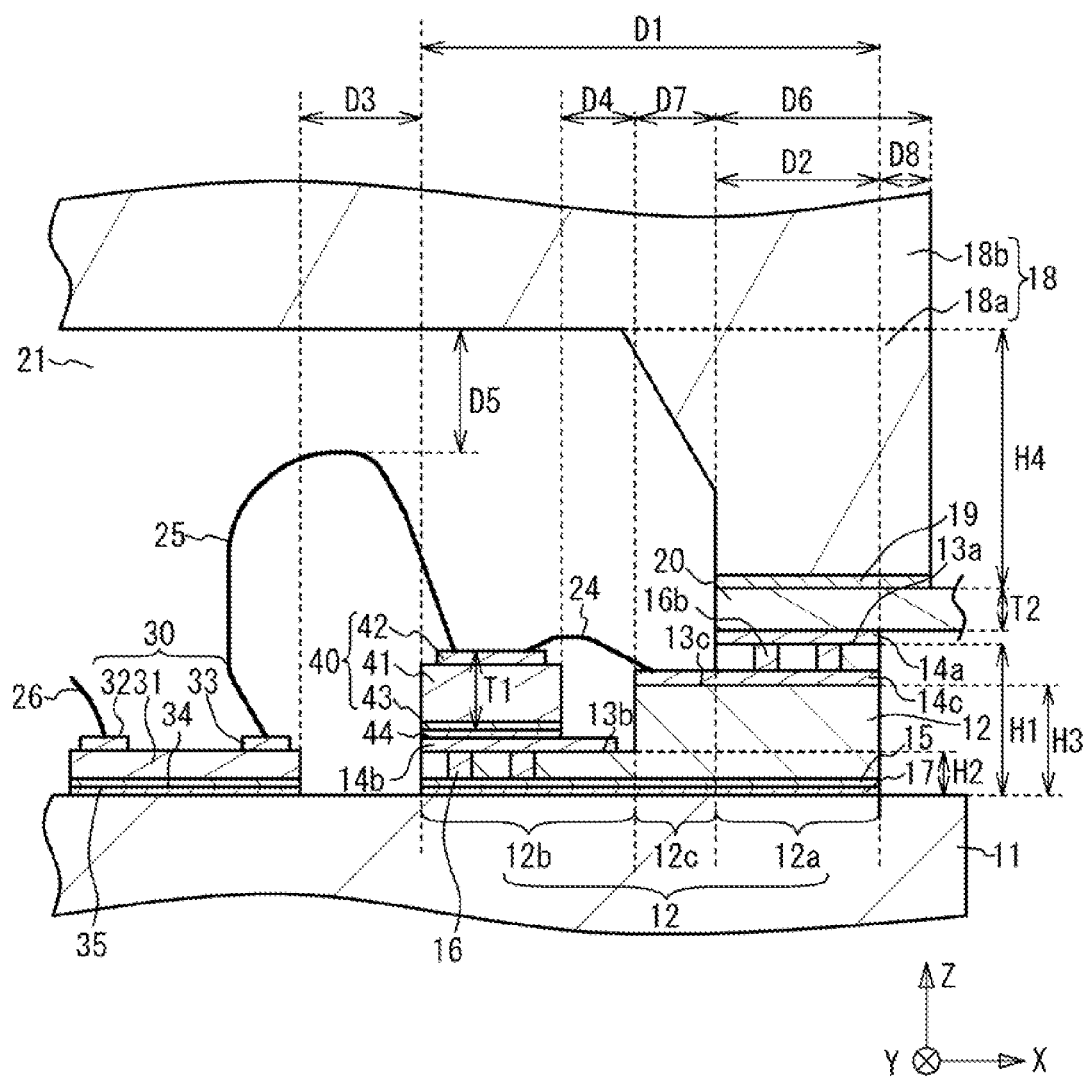
FIG. 15 is an enlarged cross-sectional view of a semiconductor device according to Modification 1 of Example 2.

FIG. 15 is an enlarged cross-sectional view of a semiconductor device according to Modification 1 of Example 2. As illustrated in FIG. 15, the width D6 of the lateral section 18a of the cover 18 is the same as in FIG. 3 of Example 1. The outer lateral face of the lateral section 18a is positioned outwardly of the outer lateral face of the frame 12 by the distance D8. The distance D8 is, for instance, 0.15 mm. Thus, the distance D7 between the end face of the intermediate section 12c and the inner lateral face of the lateral section 18a can be increased. When the joint strength between the lateral section 18a and the frame 12 is sufficient, the width D2 may be reduced. Other components are the same as those in Example 2, and a description is omitted.

In Modification 1 of Example 2, the lateral section 18a is disposed more outwardly than in Example 2, thus the distance D7 can be increased. Therefore, breakage of the bonding wire 24 can be prevented. In addition, the strength of the lateral section 18a can be maintained by setting the width D6 of the lateral section 18a equal to that in FIG. 14 of Example 2.

Modification 2 of Example 2

Figure 16:
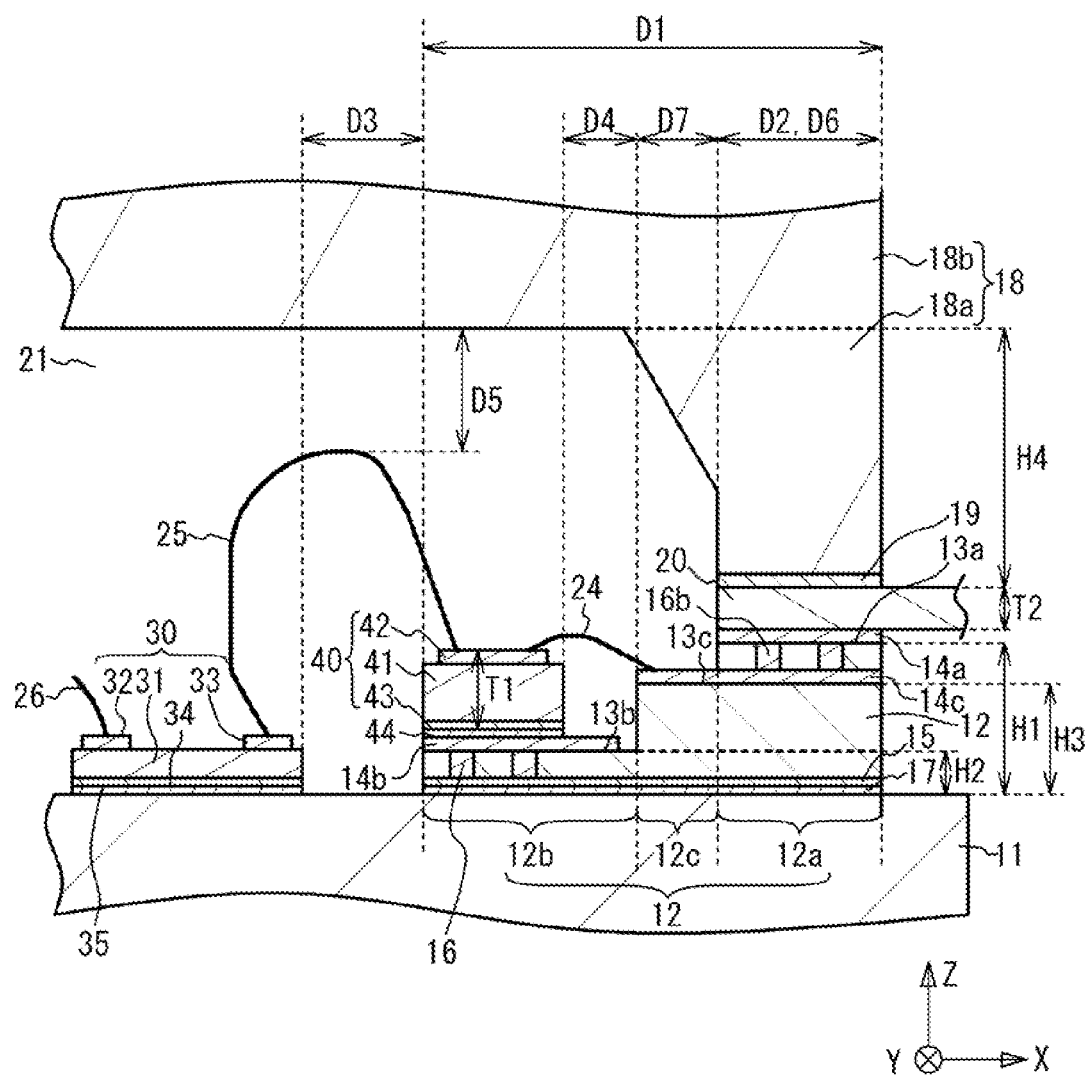
FIG. 16 is an enlarged cross-sectional view of a semiconductor device according to Modification 2 of Example 2.

FIG. 16 is an enlarged cross-sectional view of a semiconductor device according to Modification 2 of Example 2. As illustrated in FIG. 16, the width D6 of the lateral section 18a is the same as the width D2 of joint between the lateral section 18a and the output lead 20. Other components are the same as those in Modification 1 of Example 2, and a description is omitted. In Modification 2 of Example 2, breakage of the bonding wire 24 can be prevented as in Modification 1 of Example 2. Furthermore, the outer lateral face of the lateral section 18a substantially matches the outer lateral face of the frame 12. Consequently, in contrast to FIG. 15 of Modification 1 of Example 2, the outer shape of the semiconductor device can be downsized to be approximately the same as in Example 2.

Modification 3 of Example 2

Figure 17:
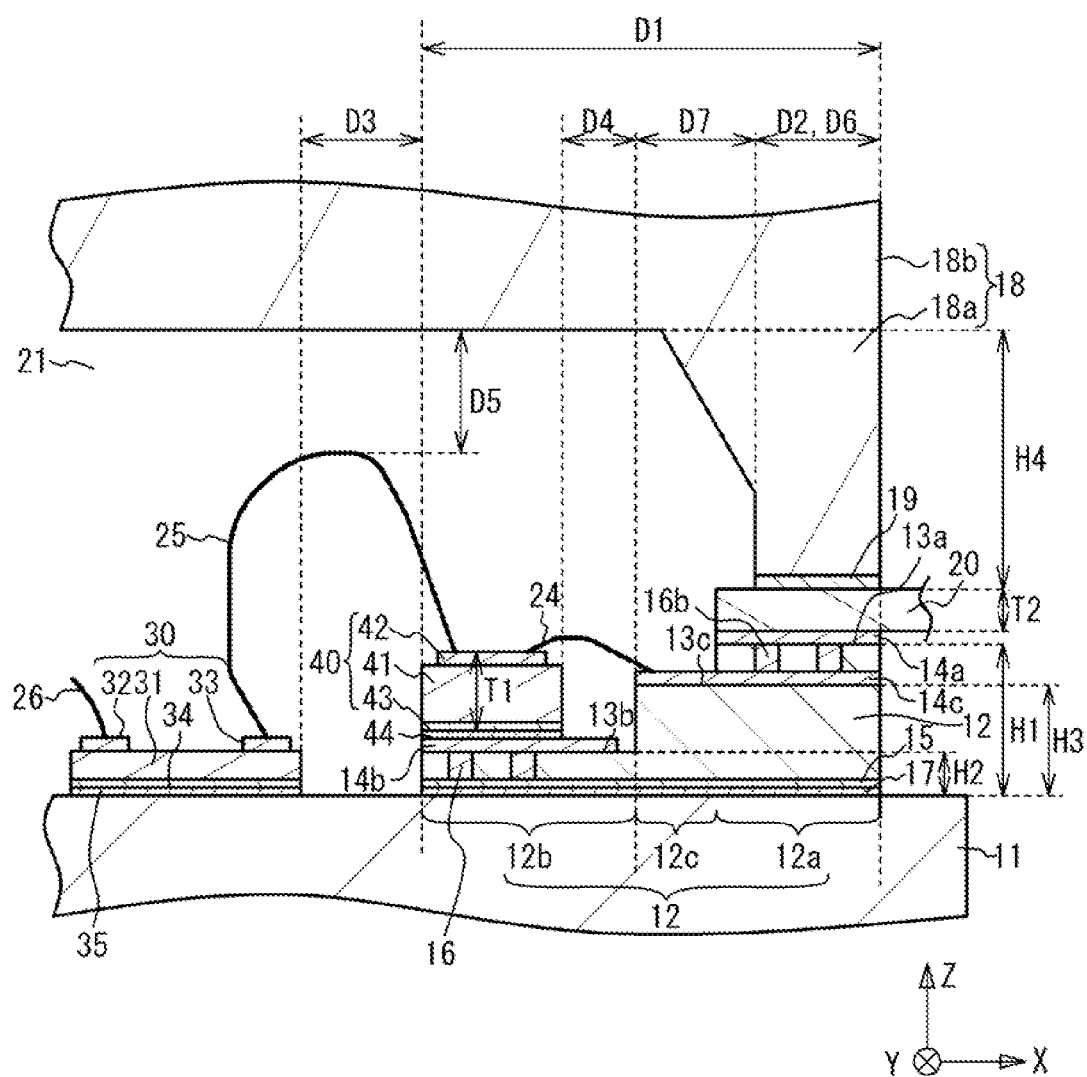
FIG. 17 is an enlarged cross-sectional view of a semiconductor device according to Modification 3 of Example 2.

FIG. 17 is an enlarged cross-sectional view of a semiconductor device according to Modification 3 of Example 2. As illustrated in FIG. 17, the width D2 of joint between the lateral section 18a and the output lead 20 is approximately the same as the width D6 of the lateral section 18a. D2 and D6 are, for instance, 0.25 mm. The inner lateral face of the lateral section 18a is positioned outwardly of the inner lateral face of the thick film section 12a by 0.2 mm, for instance. Therefore, the distance D7 between the inner lateral face of the intermediate section 12c and the lateral section 18a can be increased. Other components are the same as those in Modification 2 of Example 2, and a description is omitted.

In Modification 3 of Example 2, breakage of the bonding wire 24 can be prevented more than in Modification 2 of Example 2. Furthermore, the outer lateral face of the lateral section 18a substantially matches the outer lateral face of the frame 12. Consequently, the outer shape of the semiconductor device can be downsized to be approximately the same as in Example 2.

As in Example 2 and its modifications, the lateral section 18a is joined to the upper surface 13a, and not joined to the upper surface 13c. Consequently, when the cover 18 is joined to the frame 12, breakage of the bonding wire 24 can be prevented.

Modification 4 of Example 2

Figure 18:
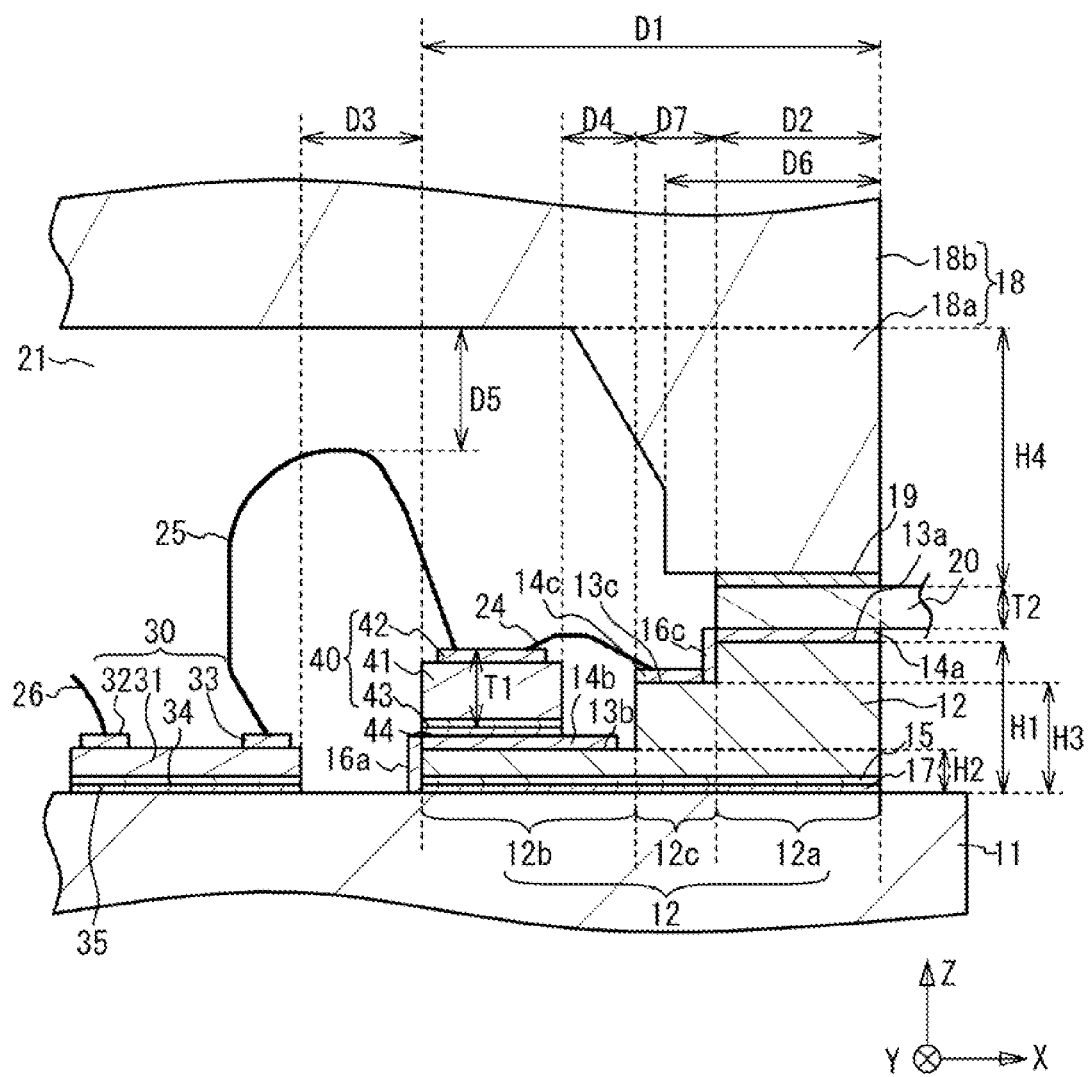
FIG. 18 is an enlarged cross-sectional view of a semiconductor device according to Modification 4 of Example 2.

FIG. 18 is an enlarged cross-sectional view of a semiconductor device according to Modification 4 of Example 2. As illustrated in FIG. 18, in Modification 4 of Example 2, instead of the through electrode 16, the conductor layer 16a is provided on the lateral face of an end of the thin film section 12b. The conductor layer 16a electrically connects and short-circuits the conductor patterns 14b and 15. Instead of the internal wire 16b, a conductor layer 16c is provided on the inner lateral face of the thick film section 12a between the upper surfaces 13a and 13c. The conductor layer 16c electrically connects and short-circuits the conductor patterns 14a and 14c. Other components are the same as those in Example 2, and a description is omitted. In Modification 4 of Example 2, the conductor pattern 14c does not need to extend into the frame 12. Therefore, this facilitates the manufacturing of the frame 12.

As in Example 2 and its Modifications 1 to 4, the conductor pattern 14c and the output lead 20 may be electrically connected by the internal wire 16b in the frame 12, or may be electrically connected by the conductor layer 16c provided on the lateral face of the thick film section 12a. In Examples 1, 2 and their modifications, the frame 12 may be obtained by molding multiple members and subsequently joining them, or may be resin molded integrally.

It is to be understood that the embodiments disclosed herein are illustrative and not restrictive in all respects. It is intended that the scope of the present disclosure be defined by the appended claims rather than the foregoing description, and that all changes within the meaning and range of equivalency of the claims be embraced therein.

What is claimed is:

1. A semiconductor device comprising:
   a base substrate that is conductive and has a mountable area;
   a semiconductor chip mounted on the mountable area and having a signal pad;
   a frame surrounding the mountable area in a plan view, the frame being mounted on the base substrate, and including an inner first upper surface, an outer second upper surface, and a step in the plan view, the inner first upper surface being provided between the mountable area and the outer second upper surface in the plan view, the inner first upper surface being higher than the mountable area and lower than the outer second upper surface in a normal direction, the step being formed between the inner first upper surface and the outer second upper surface, and the inner first upper surface having a first conductor pattern that is electrically grounded and electrically connected to the base substrate;
   a signal terminal mounted on the outer second upper surface of the frame;
   a capacitive component mounted on the first conductor pattern such that the capacitive component is interposed both physically and electrically between the signal pad and the signal terminal and provided out of the mountable area in the plan view;
   a first bonding wire configured to electrically connect the signal pad and an upper surface of the capacitive component;
   a second bonding wire configured to electrically connect the upper surface of the capacitive component and the signal terminal; and
   a cover joined to the outer second upper surface of the frame, and sealing the semiconductor chip in an inner space.

2. The semiconductor device according to claim 1, wherein the second bonding wire is joined to the signal terminal.

3. The semiconductor device according to claim 2, wherein a height difference between the upper surface of the capacitive component and an upper surface of the signal terminal is smaller than a difference between a thickness of the capacitive component and a thickness of the signal terminal.

4. The semiconductor device according to claim 2, wherein
   the cover includes a lateral portion joined to the outer second upper surface of the frame, and an upper portion provided above the semiconductor chip, and
   the lateral portion is joined to the upper surface of the signal terminal outwardly in the plan view of a position at which the second bonding wire is joined to the signal terminal.

5. The semiconductor device according to claim 1, wherein
   the step of the frame has a third upper surface between the inner first upper surface and the outer second upper surface in the plan view, the third upper surface being higher than the inner first upper surface and lower than the outer second upper surface, and a second conductor pattern electrically connected to the signal terminal is provided on the third upper surface, and
   the second bonding wire is connected to the signal terminal via the second conductor pattern.

6. The semiconductor device according to claim 5, wherein a height difference between the upper surface of the capacitive component and an upper surface of the second conductor pattern is smaller than a difference between a thickness of the capacitive component and a height difference between the inner first upper surface and the outer second upper surface.

7. The semiconductor device according to claim 5, wherein
   the cover includes a lateral portion joined to the outer second upper surface of the frame, and an upper portion provided above the semiconductor chip, and
   the lateral portion is joined to the outer second upper surface and not joined to the third upper surface.

8. The semiconductor device according to claim 1, wherein the semiconductor chip includes a transistor, and the signal pad is at least one of an input pad via which a high-frequency signal is input to the transistor and an output pad via which a high-frequency signal is output from the transistor.

9. The semiconductor device according to claim 1, wherein the first conductor pattern and the base substrate are electrically connected by a through electrode that penetrates the frame or by another conductor layer provided on an inner lateral face of the frame.

10. A package comprising:
a base substrate that is conductive and includes a mountable area on which a semiconductor chip is mounted;
a frame surrounding the mountable area in a plan view, the frame being mounted on the base substrate, and including an inner first upper surface and an outer second upper surface in the plan view, the inner first upper surface being provided between the mountable area and the outer second upper surface in the plan view, the inner first upper surface being higher than the mountable area and lower than the outer second upper surface in a normal direction, and the inner first upper surface being electrically connected to an upper surface of the base substrate;
a signal terminal mounted on the outer second upper surface of the frame; and
a capacitive component is interposed both physically and electrically between the signal pad and the signal terminal and provided out of the mountable area in the plan view,
wherein the inner first upper surface has a first conductor pattern that is electrically grounded and electrically connected to the base substrate.

11. The package according to claim 10, wherein
the inner first upper surface has the first conductor pattern, and
the first conductor pattern and the base substrate are electrically connected by a through electrode that penetrates the frame or by another conductor layer provided on an inner lateral face of the frame.

12. The package according to claim 11, wherein
the first conductor pattern and the base substrate have a same potential.

13. The package according to claim 10, further comprising:
wherein the signal terminal has an upper surface to which a bonding wire is joined.

14. A semiconductor device comprising:
a base substrate that is conductive and has a mountable area;
a semiconductor chip mounted on the mountable area and having a signal pad;
a frame surrounding the mountable area in a plan view, the frame being mounted on the base substrate, and including an inner first upper surface, an outer second upper surface, and a step in the plan view, the inner first upper surface being provided between the mountable area and the outer second upper surface in the plan view, the inner first upper surface being higher than the mountable area and lower than the outer second upper surface in a normal direction, the step being formed between the inner first upper surface and the outer second upper surface;
a third upper surface of the frame provided between the inner first upper surface and the outer second upper surface in the plan view, the third upper surface being higher than the inner first upper surface and lower than the outer second upper surface;
a first conductor pattern provided on the inner first upper surface, the first conductor pattern being electrically connected to the base substrate and having a ground potential;
a signal terminal mounted on the outer second upper surface of the frame;
a second conductor pattern provided on the third upper surface and electrically connected to the signal terminal;
a capacitive component mounted on the first conductor pattern, provided out of the mountable area in the plan view, and electrically interposed between the signal pad and the signal terminal;
a first bonding wire electrically connecting the signal pad and an upper surface of the capacitive component;
a second bonding wire electrically connecting the upper surface of the capacitive component to the second conductor pattern on the third upper surface, wherein a height difference between the upper surface of the capacitive component and the second conductor pattern is smaller than a height difference between the inner first upper surface and the outer second upper surface; and
a cover joined to the outer second upper surface of the frame and sealing the semiconductor chip in an inner space.

* * * * *